(12) United States Patent
Lee et al.

US008295087B2

(10) Patent No.: US 8,295,087 B2
(45) Date of Patent: Oct. 23, 2012

(54) ROW-DECODER AND SELECT GATE DECODER STRUCTURES SUITABLE FOR FLASHED-BASED EEPROM OPERATING BELOW +/− 10V BVDS

(75) Inventors: Peter Wung Lee, Saratoga, CA (US); Fu-Chang Hsu, San Jose, CA (US); Hsing-Ya Tsao, San Jose, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 599 days.

(21) Appl. No.: 12/456,354

(22) Filed: Jun. 16, 2009

(65) Prior Publication Data
US 2009/0310405 A1 Dec. 17, 2009

Related U.S. Application Data

(60) Provisional application No. 61/132,122, filed on Jun. 16, 2008, provisional application No. 61/132,628, filed on Jun. 20, 2008.

(51) Int. Cl.
*G11C 16/04* (2006.01)
*G11C 11/4193* (2006.01)

(52) U.S. Cl. ......... 365/185.17; 365/185.05; 365/185.18; 365/185.23; 365/185.26; 365/185.28; 365/185.29; 365/184

(58) Field of Classification Search ............. 365/185.17, 365/185.05, 185.18, 185.23, 185.26, 185.28, 365/185.29, 184
See application file for complete search history.

(56) References Cited

U.S. PATENT DOCUMENTS

| | | | |
|---|---|---|---|
| 5,162,880 A | 11/1992 | Hazama et al. | |
| 5,471,422 A * | 11/1995 | Chang et al. | 365/185.26 |
| 5,862,082 A * | 1/1999 | Dejenfelt et al. | 365/185.33 |
| 5,901,090 A | 5/1999 | Haddad et al. | |
| 5,912,842 A * | 6/1999 | Chang et al. | 365/185.11 |
| 6,023,188 A * | 2/2000 | Lee et al. | 327/536 |
| 6,295,229 B1 * | 9/2001 | Chang et al. | 365/185.28 |
| 6,307,781 B1 * | 10/2001 | Shum | 365/185.17 |
| 6,510,085 B1 | 1/2003 | Fastow et al. | |
| 6,620,682 B1 | 9/2003 | Lee et al. | |
| 6,628,563 B1 | 9/2003 | Hsu et al. | |

(Continued)

OTHER PUBLICATIONS

Jul. 26, 2009, Aplus Flash Technology, Inc.

(Continued)

*Primary Examiner* — Hoai V Ho
*Assistant Examiner* — Jay Radke
(74) *Attorney, Agent, or Firm* — Saile Ackerman LLC; Stephen B. Ackerman; Billy Knowles

(57) ABSTRACT

A nonvolatile memory device includes an array of EEPROM configured nonvolatile memory cells each having a floating gate memory transistor for storing a digital datum and a floating gate select transistor for activating the floating gate memory transistor for reading, programming, and erasing. The nonvolatile memory device has a row decoder to transfer the operational biasing voltage levels to word lines connected to the floating gate memory transistors for reading, programming, verifying, and erasing the selected nonvolatile memory cells. The nonvolatile memory device has a select gate decoder circuit transfers select gate control biasing voltages to the select gate control lines connected to the control gate of the floating gate select transistor for reading, programming, verifying, and erasing the floating gate memory transistor of the selected nonvolatile memory cells. The operational biasing voltage levels are generated to minimize operational disturbances and preventing drain to source breakdown in peripheral devices.

93 Claims, 18 Drawing Sheets

U.S. PATENT DOCUMENTS

| | | | |
|---|---|---|---|
| 6,711,058 | B1 | 3/2004 | Hirano |
| 6,777,292 | B2 | 8/2004 | Lee et al. |
| 6,807,103 | B2 | 10/2004 | Cavaleri et al. |
| 6,818,491 | B2 | 11/2004 | Lee et al. |
| 7,042,767 | B2 | 5/2006 | Wang et al. |
| 2003/0189864 | A1 | 10/2003 | Sim |
| 2004/0047203 | A1* | 3/2004 | Lee et al. ............... 365/202 |
| 2004/0145024 | A1* | 7/2004 | Chen et al. ............... 257/390 |
| 2005/0248993 | A1* | 11/2005 | Lee et al. ............. 365/185.29 |
| 2006/0221660 | A1* | 10/2006 | Hemink et al. ............ 365/100 |
| 2006/0245254 | A1* | 11/2006 | Ishii et al. ............. 365/185.18 |
| 2007/0034934 | A1 | 2/2007 | Arai et al. |
| 2007/0140036 | A1 | 6/2007 | Noguchi et al. |
| 2007/0206416 | A1* | 9/2007 | Hazama et al. ........ 365/185.05 |
| 2008/0089136 | A1* | 4/2008 | Yoo et al. ............. 365/185.29 |
| 2009/0287879 | A1* | 11/2009 | Oh et al. ................... 711/103 |

OTHER PUBLICATIONS

Co-pending U.S. Appl. No. 12/387,771, filed May 7, 2009, "A NAND Based NMOS NOR Flash Memory Cell, a NAND Based NMOS NOR Flash Memory Array, and a Method of Forming a NAND Based NMOS NOR Flash Memory Array," assigned to the same assignee as the present invention.

Co-pending U.S. Appl. No. 12/455,337, filed Jun. 1, 2009, "A NAND String Based NAND/NOR Flash Memory Cell, Array, and Memory Device Having Parallel Bit Lines and Source Lines, having a Programmable Select Gating Transistor, and Circuits and Methods for Operating Same," assigned to the same assignee as the present invention.

Co-pending U.S. Appl. No. 12/455,936, filed Jun. 9, 2009, "Row-Decoder and Source-Decoder Structures Suitable for Erase in Unit of Page, Sector and Chip of a NOR-Type Flash Operating Below +/-31 10V BVDS," assigned to the same assignee as the present invention.

Co-pending U.S. Appl. No. 12/456,744, filed Jun. 22, 2009, "An Apparatus and Method for Inhibiting Excess Leakage Current in Unselected Nonvolatile Memory Cells in an Array," assigned to the same assignee as the present invention.

* cited by examiner

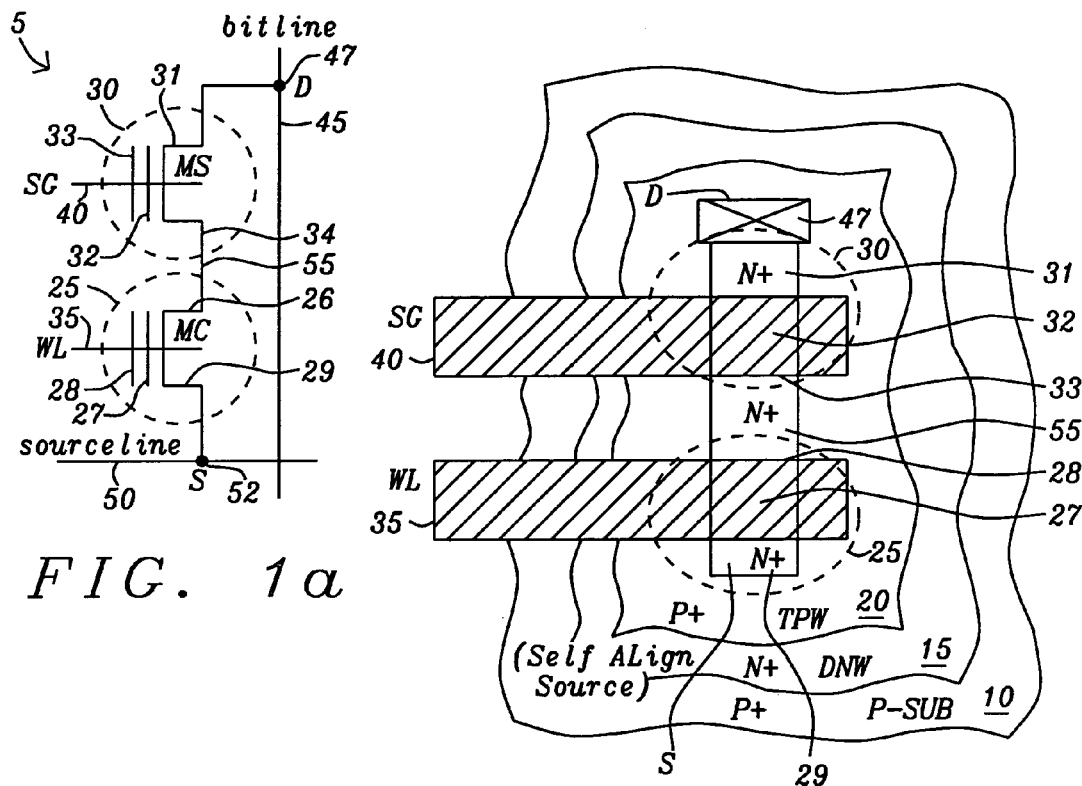
FIG. 1a
FIG. 1b
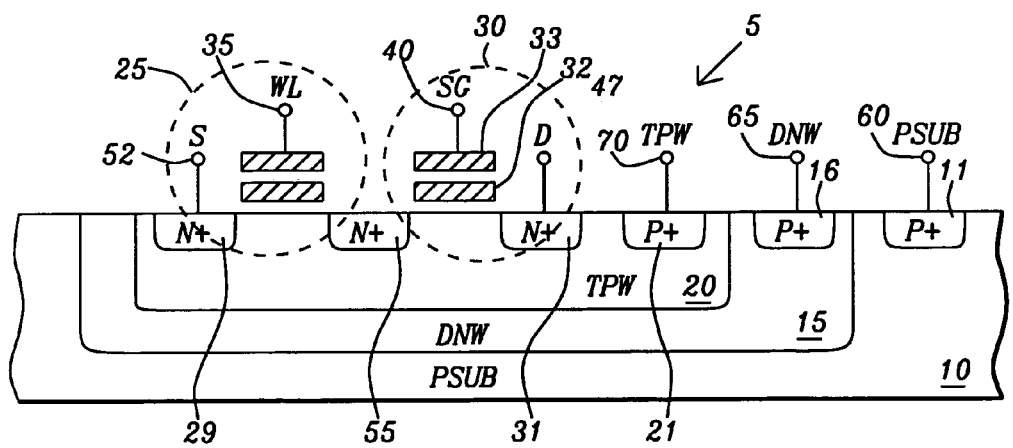
FIG. 1c

| | WL (Unsel BLK:) 275u | WL (Sel BLK:) SEL 275s | WL (Sel BLK:) UNSEL 275su | BL SEL 270s | BL UNSEL 270u | SG SEL 280s | SG UNSEL 280u | SL 135 | TPW 212 |
|---|---|---|---|---|---|---|---|---|---|
| READ | VR | VR | VR | 1V | 0V | HV" | 0V | 0V | 0V |
| PAGE ERASE | −10V! | 10V | 0V* | −10V | — | −10V | −10V | −10V | −10V |
| PAGE ERASE VERIFY | Vt1L | Vt1L | Vt1L | Vdd-Vt/0V | — | HV" | 0V | 0V | 0V |
| BLOCK ERASE | −10V! | 10V | — | −10V | — | −10V | −10V | −10V | −10V |
| BLOCK ERASE VERIFY | Vt1L | Vt1L | Vt1L | Vdd-Vt/0V | — | HV" | 0V | 0V | 0V |
| CHIP ERASE | — | 10V | — | −10V | — | −10V | — | −10V | −10V |
| CHIP ERASE VERIFY | Vt1L | Vt1L | Vt1L | Vdd-Vt/0V | — | HV" | — | 0V | 0V |
| PAGE PROGRAM | Floating | −10V | 0V | 5V | 0V | 10V | 0V | 0V | 0V |
| PAGE PROGRAM VERIFY | VtOH | VtOH | VtOH | Vdd-Vt/0V | Vdd-Vt | HV" | 0V | 0V | 0V |

LEGEND
−10V!: Coupled from EEPROM Array's TPW
0V*: Coupled from EEPROM Array's TPW
HV": HV~=5V

FIG. 11

| | WL (Sel Blk) | | WL (Unsel BLK) | | XT | | XD | | NW | | ISOB | RDB | VPX | VNX | ENVNX |
|---|---|---|---|---|---|---|---|---|---|---|---|---|---|---|---|
| | Sel 275s | Unsel 275su | Sel 410s | Unsel 410u | Sel 335s | Unsel 335u | Sel 330s | Unsel 330u | Sel 352s | Unsel 352u | 366 | 364 | 327 | 326 | 328 |
| READ | VR | VR | VR | VR | VR | VR | VDD | VDD | VDD | VDD | -5V | 0V | VDD | 0V | 0V |
| PAGE ERASE | 10V | 0V* | -10V! | 0V | 10V | 0V | 10V | 0V | 0V | 0V | 0V | 10V | VDD | 0V | 0V |
| PAGE ERASE VERIFY | Vt1L | Vt1L | Vt1L | Vt1L | Vt1L | Vt1L | Vt1L | Vt1L | Vt1L | Vt1L | -5V | 0V | 10V | 0V | 0V |
| BLOCK ERASE | 10V | – | -10V! | – | 10V | – | 10V | – | 0V | 0V | 0V | 10V | Vt1L | 0V | 0V |
| BLOCK ERASE VERIFY | Vt1L | Vt1L | Vt1L | Vt1L | Vt1L | Vt1L | Vt1L | Vt1L | Vt1L | Vt1L | -5V | 0V | 10V | 0V | 0V |
| CHIP ERASE | 10V | – | – | – | – | – | 10V | – | 10V | – | 0V | 10V | Vt1L | 0V | 0V |
| CHIP ERASE VERIFY | Vt1L | Vt1L | Vt1L | Vt1L | Vt1L | Vt1L | Vt1L | Vt1L | Vt1L | Vt1L | -5V | 0V | Vt1L | 0V | Vt1L |
| PROGRAM | -10V | 0V | FLOAT-INC | -10V | 10V | -10V | 0V | -10V | VDD | VDD | -12V | 0V | 0V | -10V | VDD |
| PROGRAM VERIFY | Vt0H | Vt0H | Vt0H | Vt0H | Vt0H | Vt0H | VDD | VDD | VDD | VDD | -5V | 0V | VDD | 0V | 0V |

LEGEND
0V*: Coupled from EEPROM Array's TPW
-10V!: Coupled from EEPROM Array's TPW
VR ~= VDD

FIG. 12a

| | WL (Sel BLK) Sel 280s | WL Unsel 280su | WL (Unsel BLK) Sel 280u | WL Unsel 280su | XT Sel 435s | XT Unsel 435u | XD Sel 430s | XD Unsel 430u | NW Sel 452s | NW Unsel 452u | ISOB 466 | RDB 464 | VPX 427 | VPN 426 | ENVNX 428 |
|---|---|---|---|---|---|---|---|---|---|---|---|---|---|---|---|
| READ | HV″ | 0V | 0V | 0V | HV″ | 0V | HV″ | 0V | HV″ | HV″ | −5V | 0V | HV″ | 0V | 0V |
| PAGE ERASE | −10V | −10V | −10V | −10V | −10V | −10V | −10V | −10V | 0V | 0V | −12V | 10V | 0V | −10V | VDD |
| PAGE ERASE VERIFY | HV″ | 0V | 0V | 0V | HV″ | 0V | HV″ | 0V | HV″ | HV″ | −5V | 0V | HV″ | 0V | 0V |
| BLOCK ERASE | −10V | −10V | −10V | −10V | −10V | −10V | −10V | −10V | 0V | 0V | −12V | 10V | 0V | −10V | VDD |
| BLOCK ERASE VERIFY | HV″ | 0V | 0V | 0V | HV″ | 0V | HV″ | 0V | HV″ | HV″ | −5V | 0V | HV″ | 0V | 0V |
| CHIP ERASE | −10V | −10V | −10V | −10V | −10V | −10V | −10V | −10V | 0V | 0V | −12V | 10V | 0V | −10V | VDD |
| CHIP ERASE VERIFY | HV″ | 0V | 0V | 0V | HV″ | 0V | HV″ | 0V | HV″ | HV″ | −5V | 0V | HV″ | 0V | 0V |
| PAGE PROGRAM | 10V | 0V | 0V | 0V | 10V | 0V | 10V | 0V | 10V | 10V | 0V | 0V | 10V | 0V | 0V |
| PAGE PROGRAM VERIFY | HV″ | 0V | 0V | 0V | HV″ | 0V | HV″ | 0V | HV″ | HV″ | −5V | 0V | HV″ | 0V | 0V |

ROW-DECODER AND SELECT GATE DECODER STRUCTURES SUITABLE FOR FLASHED-BASED EEPROM OPERATING BELOW +/− 10V BVDS

This application claims priority under 35 U.S.C. §119 to U.S. Provisional Patent Application U.S. Patent Application Ser. No. 61/132,122, filed on Jun. 16, 2008, assigned to the same assignee as the present invention, and incorporated herein by reference in its entirety.

This application claims priority under 35 U.S.C. §119 to U.S. Provisional Patent Application U.S. Patent Application Ser. No. 61/132,628, filed on Jun. 20, 2008, assigned to the same assignee as the present invention, and incorporated herein by reference in its entirety.

RELATED PATENT APPLICATIONS

U.S. patent application Ser. No. 12/387,771, filed on May 7, 2009, assigned to the same assignee as the present invention.

U.S. patent application Ser. No. 12/455,337, filed on Jun. 1, 2009 assigned to the same assignee as the present invention.

U.S. patent application Ser. No. 12/455,936, filed on Jun. 9, 2009, assigned to the same assignee as the present invention.

U.S. patent application Ser. No. 12/456,744, filed Jun. 22, 2009, assigned to the same assignee as the present invention.

BACKGROUND OF THE INVENTION

1. Field of the Invention

This invention relates generally to nonvolatile memory array structure and operation. More particularly, this invention relates to flash based EEPROM nonvolatile memory device structures, peripheral circuits for operating flash based EEPROM nonvolatile memory devices and methods for operation of flash based EEPROM nonvolatile memory devices.

2. Description of Related Art

Nonvolatile memory is well known in the art. The different types of nonvolatile memory include Read-Only-Memory (ROM), Electrically Programmable Read Only Memory (EPROM), Electrically Erasable Programmable Read Only Memory (EEPROM), NOR Flash Memory, and NAND Flash Memory. In current applications such as personal digital assistants, cellular telephones, notebook and laptop computers, voice recorders, global positioning systems, etc., the Flash Memory has become one of the more popular types of Nonvolatile Memory. All EEPROM, NOR and NAND flash are Electrically Erasable and Programmable Memory using a single low-voltage power supply VDD but only EEPROM offers an erase size in unit of bytes and page with 1 M program/erase cycles.

The Flash Memory structures known in the art employ a charge retaining mechanism such as a charge storage phenomena and a charge trapping phenomena. The charge storage mechanism, as with a floating gate nonvolatile memory, the charge representing digital data is stored on a floating gate of the device. The stored charge modifies the threshold voltage of the floating gate memory cell determine that digital data stored. In a charge trapping mechanism, as in a Silicon-Oxide-Nitride-Oxide-Silicon (SONOS) or Metal-Oxide-Nitride-Oxide-Silicon (MONOS) type cell, the charge is trapped in a charge trapping layer between two insulating layers. The charge trapping layer in the SONOS/MONOS devices has a relatively high dielectric constant (k) such Silicon Nitride ($SiN_x$).

NOR flash provides a fast random-access, asynchronous read, but NAND flash offers a slow serial-access, synchronous read. NOR flash is the high pin-count memory chip with multiple external address and data pins, and control signal pins. One disadvantage of NOR flash is as the density being doubled, the number of its required external pin count would increase by one due to the adding of one more external address pin. In contrast, NAND has advantage of less pin-count than NOR with no address input pins. As density increases, NAND's pin count is always kept constant. Both today's NAND and NOR flash provide the advantage of in-system program and erase capabilities with 100K endurance cycles spec. NOR flash is used to store fast program code but NAND is used to store huge slow serial audio and video data storage. The size of the memory units that are erased in a NOR and NAND flash is presently around 1M bits in a giga-bit density memory device. Alternately, an EEPROM provides a unit of erase that is capable of storing a byte and a page, to permit alteration of small quantities of data or parameters.

Up until 2008, the EEPROM designs were based on a semiconductor manufacturing process where the transistor devices had a drain-to-source breakdown voltage (BVDS) of approximately ±16V. In 2008, the semiconductor manufacturing processing moved to having feature sizes less than 0.13 μm. The current EEPROM design employ program and erase voltage levels of approximately +15.0V. The current EEPROM memory cell is designed having a polycrystalline silicon floating-gate placed over a tunneling oxide. A polycrystalline control gate is formed over an inter-polycrystalline silicon oxide layer above the floating gate. Low current Fowler-Nordheim channel erase operation is used to increase the threshold voltage Vt of the memory cell above the desired value of +2.0V to store a digital datum of a logical "1". A low-current Fowler-Nordheim channel program operation is used to decrease threshold voltage Vt of the memory cell to a voltage level of approximately −2.0V to store digital datum of a logical "0".

The advantage of an EEPROM memory device is its high 1M program/erase cycles and its ability to be programmed in units of byte and page. However, a disadvantage of an EEPROM memory device is that the physical size of a memory cell is very large and not scalable. The averaged cell size is more than 80 $\lambda^2$ and because of the inability to be scaled the manufacturing technology is employing feature sizes of approximately 0.18μ. And as noted above, the EEPROM designs were based on a drain-to-source breakdown voltage (BVDS) of approximately ±16V.

SUMMARY OF THE INVENTION

An object of this invention is to provide a method for operating an array of EEPROM connected flash nonvolatile memory cells at increments of a page and block while minimizing operational disturbances and providing bias operating conditions to prevent drain to source breakdown drain to source breakdown in peripheral devices.

Another object of this invention is to provide a row decoder circuit for selecting nonvolatile memory cells of an array of EEPROM connected nonvolatile memory cells for providing biasing conditions for reading, programming, verifying, and erasing the selected nonvolatile memory cells of the array of the EEPROM connected nonvolatile memory cells while minimizing operational disturbances and preventing drain to source breakdown in peripheral devices.

Further, another object of this invention is to provide a select gate decoder circuit for selecting and providing biasing conditions to selected nonvolatile memory cells of an array of EEPROM connected nonvolatile memory cells for reading, programming, verifying, and erasing the selected nonvolatile memory cells of the array of the EEPROM connected nonvolatile memory cells while minimizing operational disturbances and preventing drain to source breakdown of peripheral devices.

To accomplish at least one of these objects, a nonvolatile memory device includes an array of nonvolatile memory cells arranged in rows and columns. The nonvolatile memory cells are connected into an EEPROM configuration where the nonvolatile memory cells located on each column are connected such that the drains of each of the nonvolatile memory cells are commonly connected to a bit line associated with each column. The nonvolatile memory cells on each row are commonly connected to a word line. The nonvolatile memory cells on two adjacent rows are commonly connected to a select gate control line. The array of nonvolatile memory cells is placed in an isolation well of a first impurity type. The array of the nonvolatile memory cells is divided into blocks and each block is divided into pages. Each page includes one row of the nonvolatile memory cells within each block of each sector connected to a word line.

The EEPROM configured nonvolatile memory cells each have a floating gate memory transistor for storing a digital datum and a floating gate select transistor for activating the floating gate memory transistor for reading, programming, and erasing. The drain of the floating gate memory transistor is connected to the source of the floating gate select transistor and the drain of the floating gate select transistor is connected to the bit line that is commonly connected with one column of the EEPROM configured nonvolatile memory cells. The source of the floating gate memory transistor is connected to a source line that is commonly connected with the one row of the EEPROM configured nonvolatile memory cells. A gate of the floating gate select transistor is connected to the connected to a select gate control line associated with one row of the EEPROM configured memory cells for receiving a select gate control biasing voltages for selectively activating the floating gate select transistor to connect the floating gate memory transistor to the bit line for reading, programming, and erasing the floating gate memory cell. The gate of the floating gate memory cell is connected to the word line for receiving operational biasing voltages for reading, programming, and erasing the floating gate memory transistor.

The nonvolatile memory device has a row decoder that has a first block selector that sets a block signal when a block address indicates that a block is selected. The row decoder further includes a word line selector circuit, which based on a row address provides the word lines with word line operational biasing voltage levels necessary for biasing the control gates of the EEPROM configured nonvolatile memory cells for reading, programming, verifying, and erasing. The row decoder has a voltage level shifter for shifting a voltage level of a block select signal to activate pass gates to transfer the operational biasing voltage levels to the word lines of the selected block for biasing the control gates of the EEPROM configured nonvolatile memory cells of the block for reading, programming, verifying, and erasing the selected nonvolatile memory cells.

The nonvolatile memory device has a select gate decoder circuit is connected to each select gate control line within each block to transfer a necessary gate select biasing voltage for reading, programming, verifying, and erasing selected EEPROM configured nonvolatile memory cells to selected select gate control lines. The select gate decoder circuit has a second block selector circuit which activates for the selection of the block being addressed. The block selector circuit is connected to a select gate voltage level shifter that shifts the voltage level of the block selector signals for activating pass transistors to transfer select gate control biasing voltages to the select gate control lines connected to the control gate of the floating gate select transistor of each of the EEPROM configured nonvolatile memory cells of the selected block for reading, programming, verifying, and erasing the floating gate memory transistor of the selected nonvolatile memory cells.

The nonvolatile memory device has a column decoder in communication with bit lines for providing biasing voltages for reading, programming, verifying, and erasing selected EEPROM configured nonvolatile memory cells. The row decoder, select gate decoder, and column decoder provide inhibit biasing voltage levels to all the non-selected nonvolatile EEPROM configured nonvolatile memory cells to minimize disturbances resulting from the reading, programming, verifying, and erasing selected EEPROM configured nonvolatile memory cells. Further the row decoder, select gate decoder, and column decoder generate the word line biasing voltages, the select gate biasing voltage, bit line biasing voltages, and the inhibit biasing voltages such that an amplitude of the word line biasing voltages, the select gate biasing voltage, bit line biasing voltages, and the inhibit biasing voltages does not exceed a drain-to-source break down voltage of transistors forming the row decoder, select gate decoder, and column decoder.

For reading a selected page of the array of EEPROM configured nonvolatile memory cells, the row decoder transfers a read reference biasing voltage level to the word line of the selected EEPROM configured nonvolatile memory cells. The row decoder further transfers read reference biasing voltage level to the word lines of the unselected EEPROM configured nonvolatile memory cells in the selected and unselected blocks. The column decoder transfers a first read biasing voltage to the drains of the selected EEPROM configured nonvolatile memory cells and the voltage level of the ground reference voltage source to the drains of the unselected EEPROM configured nonvolatile memory cells. The select gate decoder transfers an activate select gate signal to the select gate control lines of the selected EEPROM configured nonvolatile memory cells and transfers a deactivate select gate signal to the select gate control lines of the unselected EEPROM configured nonvolatile memory cells. The source lines of the EEPROM configured nonvolatile memory cells are set to the voltage level of the ground reference voltage source. The first read biasing voltage has a voltage level of approximately +1.0V. The read reference biasing voltage level is approximately the voltage level of the power supply voltage source VDD, where voltage level of the power supply voltage source is either 1.8V or 3.0V. The bit lines are is pre-charged to the voltage level of the first read voltage of approximately the 1.0V. The pre-charged level of the first read voltage is discharged to approximately 0.0V when the memory cell has been programmed and has a threshold voltage level less than the upper boundary of the programmed threshold voltage level. If the EEPROM configured nonvolatile memory cells are erased, the pre-charged level of the first read level will be maintained when the threshold voltage of the erased EEPROM configured nonvolatile memory cells is greater than the lower boundary erased threshold voltage level of approximately +4.0V. The activate select gate signal has a voltage level of approximately +5.0V and the deactivate select gate signal has a voltage level of the voltage level of the ground reference voltage source.

For erasing a selected page of the array of EEPROM configured nonvolatile memory cells, the row decoder transfers a very high positive erase voltage to the word line of the selected EEPROM configured nonvolatile memory cells and transfers the ground reference voltage level to the word lines of the unselected EEPROM configured nonvolatile memory cells of the selected block. The row decoders of the unselected blocks of EEPROM configured nonvolatile memory cells disconnect the word lines of the unselected EEPROM configured nonvolatile memory cells so that the very high negative erase voltage is coupled from the isolation well of the first impurity type to the word lines of the unselected EEPROM configured nonvolatile memory cells in unselected blocks. The select gate decoder transfers the very high negative erase voltage to the selected and unselected select gate control lines. The source lines of the EEPROM configured nonvolatile memory cells are set to the very high negative erase voltage level. The very high negative erase voltage is applied to an isolation well of the first impurity type. The voltage levels of the very high positive erase voltage and the very high negative erase voltage are less than approximately the breakdown voltage level of transistors forming the row decoder, column decoder, and the select gate decoder. The voltage level of the very high positive erase voltage is from approximately +8.0V to approximately +10.0V and the voltage level of the very high negative erase voltage is from approximately −10.0V to approximately −8.0V.

For verifying a page erase, a selected page of the array of EEPROM configured nonvolatile memory cells, the row decoder transfers a voltage level of a lower boundary of an erased threshold voltage level to the word line of the selected and unselected EEPROM configured nonvolatile memory cells. The column decoder transfers a second read biasing voltage to the drains of the selected EEPROM configured nonvolatile memory cells. The select gate decoder transfers an activate select gate signal to the select gate control lines of the selected EEPROM configured nonvolatile memory cells and transfers a deactivate select gate signal to the select gate control lines of the unselected EEPROM configured nonvolatile memory cells. The source lines of the EEPROM configured nonvolatile memory cells are set to the voltage level of the ground reference voltage source. The lower boundary of an erased threshold voltage level is approximately +4.0V for the single level cell program. The voltage level of the second read biasing voltage is pre-charged to approximately the voltage level of the power supply voltage source less a threshold voltage of an NMOS transistor, where the voltage level of the power supply voltage source is either +1.8V or +3.0V. The pre-charged level of the second read biasing voltage level is discharged to approximately 0.0V when the memory cell has not been successfully erased and has a threshold voltage level is less than the lower boundary of the erased threshold voltage level. If the EEPROM configured nonvolatile memory cells are erased, the pre-charged level of the second biasing read voltage level will be maintained when the threshold voltage of the erased EEPROM configured nonvolatile memory cells is greater than the erased threshold voltage level. The activate select gate signal has a voltage level of approximately +5.0V and the deactivate select gate signal has a voltage level of the voltage level of the ground reference voltage source.

For erasing a selected block of the array of EEPROM configured nonvolatile memory cells, the row decoder transfers a very high positive erase voltage to all the word lines of the EEPROM configured nonvolatile memory cells of the selected block. The row decoders of the unselected blocks of EEPROM configured nonvolatile memory cells disconnect the word lines of the unselected EEPROM configured nonvolatile memory cells so that the very high negative erase voltage is coupled from the isolation well of the first impurity type to the word lines of the unselected EEPROM configured nonvolatile memory cells in unselected blocks. The select gate decoder transfers the very high negative erase voltage to the selected and unselected select gate control lines. The source lines of the EEPROM configured nonvolatile memory cells are set to the voltage level of the very high negative erase voltage. The very high negative erase voltage is applied to the isolation well of the first impurity type. The voltage levels of the very high positive erase voltage and the very high negative erase voltage are less than approximately the breakdown voltage level of transistors forming the row decoder, column decoder, and the select gate decoder. The voltage level of the very high positive erase voltage is from approximately +8.0V to approximately +10.0V and the voltage level of the very high negative erase voltage is from approximately −8.0V to approximately −10.0V.

For verifying a block erase, the row decoder transfers a voltage level of a lower boundary of an erased threshold voltage level to the word line of the selected and unselected EEPROM configured nonvolatile memory cells. The column decoder transfers a second read voltage to the drains of the selected EEPROM configured nonvolatile memory cells. The select gate decoder transfers an activate select gate signal to the select gate control lines of the selected EEPROM configured nonvolatile memory cells. The source lines of the EEPROM configured nonvolatile memory cells are set to the voltage level of the ground reference voltage source. The lower boundary of an erased threshold voltage level is approximately +4.0V for the single level cell program. The voltage level of the second read biasing voltage is pre-charged to approximately the voltage level of the power supply voltage source less a threshold voltage of an NMOS transistor, where the voltage level of the power supply voltage source is either +1.8V or +3.0V. The pre-charged level of the second read biasing voltage is discharged to approximately 0.0V when the memory cell has not been successfully erased and has a threshold voltage level is less than the lower boundary of the erased threshold voltage level. If the EEPROM configured nonvolatile memory cells are erased, the pre-charged level of the second read biasing voltage will be maintained when the threshold voltage of the erased EEPROM configured nonvolatile memory cells is greater than the erased threshold voltage level. The activate select gate signal has a voltage level of approximately +5.0V and the deactivate select gate signal has a voltage level of the voltage level of the ground reference voltage source.

For erasing an entire chip containing the array of EEPROM configured nonvolatile memory cells, the row decoder transfers a very high positive erase voltage to all the word lines of the EEPROM configured nonvolatile memory cells of the entire chip. The select gate decoder transfers the very high negative erase voltage to the selected and unselected select gate control lines. The source lines of the EEPROM configured nonvolatile memory cells are set to the very high negative erase voltage level. The very high negative erase voltage is applied to the isolation well of the first impurity type. The voltage levels of the very high positive erase voltage and the very high negative erase voltage are less than approximately the breakdown voltage level of transistors forming the row decoder, column decoder, and the select gate decoder. The voltage level of the very high positive erase voltage is from approximately +8.0V to approximately +10.0V and the voltage level of the very high negative erase voltage is from approximately −8.0V to approximately −10.0V.

For verifying erasing an entire chip, the row decoder transfers a voltage level of a lower boundary of an erased threshold voltage level to the word line of the selected and unselected EEPROM configured nonvolatile memory cells. The column decoder transfers a second read biasing voltage to the drains of the selected EEPROM configured nonvolatile memory cells. The select gate decoder transfers an activate select gate signal to the select gate control lines of the selected EEPROM configured nonvolatile memory cells. The source lines of the EEPROM configured nonvolatile memory cells are set to the voltage level of the ground reference voltage source. The lower boundary of an erased threshold voltage level is approximately +4.0V for the single level cell program. The voltage level of the second biasing read voltage is pre-charged to approximately the voltage level of the power supply voltage source less a threshold voltage of an NMOS transistor, where the voltage level of the power supply voltage source is either +1.8V or +3.0V. The pre-charged level of the second read biasing voltage is discharged to approximately 0.0V when the memory cell has not been successfully erased and has a threshold voltage level is less than the lower boundary of the erased threshold voltage level. If the EEPROM configured nonvolatile memory cells are erased, the pre-charged level will be maintained when the threshold voltage of the erased EEPROM configured nonvolatile memory cells is greater than the erased threshold voltage level. The activate select gate signal has a voltage level of approximately +5.0V.

For programming a selected page of the array of EEPROM configured nonvolatile memory cells, the row decoder transfers a very high negative program voltage to the word line of the selected EEPROM configured nonvolatile memory cells. The row decoder transfers the voltage level of the ground reference voltage source to the unselected word lines of the selected block and disconnects the words lines to float the unselected blocks of the array of EEPROM configured nonvolatile memory cells. The column decoder transfers a high program select voltage level to the bit lines and thus to the drains of the selected EEPROM configured nonvolatile memory cells that are to be programmed. The column decoder transfers a low program deselect voltage level to the bit lines and thus to the drains of the selected EEPROM configured nonvolatile memory cells that are not to be programmed. The select gate decoder transfers a high positive activate control signal to the select gate control lines connected to the selected nonvolatile voltage cells and transfers a low deactivate select gate signal to the select gate control lines connected to the selected nonvolatile voltage cells to allow them to float. The source lines of the EEPROM configured nonvolatile memory cells are set to the voltage level of the ground reference voltage source. The voltage level of the very high negative program voltage and the high positive program select voltage are less than the breakdown voltage level of transistors forming the row decoder. The voltage level of the high negative program voltage is from approximately −8.0V to approximately −10.0V. The high program select voltage is from approximately +8.0V to approximately +10.0V and the low program deselect voltage level is from approximately −2.0V to the voltage level of the ground reference voltage source (0.0V) to avoid programming of the unselected EEPROM configured nonvolatile memory cells.

For verifying a page program, a selected page of the array of EEPROM configured nonvolatile memory cells, the row decoder transfers a voltage level of an upper boundary of programmed threshold voltage level to the word line of the selected and unselected EEPROM configured nonvolatile memory cells. The column decoder transfers a second read biasing voltage to the drains of the selected EEPROM configured nonvolatile memory cells. The select gate decoder transfers an activate select gate signal to the select gate control lines of the selected EEPROM configured nonvolatile memory cells and transfers a deactivate select gate signal to the select gate control lines of the unselected EEPROM configured nonvolatile memory cells. The source lines of the EEPROM configured nonvolatile memory cells are set to the voltage level of the ground reference voltage source. The upper boundary of a programmed threshold voltage level is approximately +1.0V for the single level cell program. The bit line is pre-charged to the voltage level of the second read biasing voltage that is approximately the voltage level of the power supply voltage source less a threshold voltage of an NMOS transistor, where the voltage level of the power supply voltage source is either +1.8V or +3.0V. The pre-charged level of the second read biasing voltage is discharged to approximately 0.0V when the memory cell has been successfully programmed and has a threshold voltage level is less than the lower boundary of the erased threshold voltage level. If the EEPROM configured nonvolatile memory cells are not successfully programmed, the pre-charged level will be maintained when the threshold voltage of the programmed EEPROM configured nonvolatile memory cells is greater than the upper boundary of the programmed threshold voltage level. The activate select gate signal has a voltage level of approximately +5.0V and the deactivate select gate signal has a voltage level of the voltage level of the ground reference voltage source.

In other embodiments, a method for operating an array includes steps for providing the operating conditions for reading, page erasing, block erasing, chip erasing, page erase verifying, block erase verifying, chip erase verifying, page programming, and page program verifying of selected EEPROM configured nonvolatile memory cells of the array of EEPROM configured nonvolatile memory cells. For the step of reading a selected page of the array of EEPROM configured nonvolatile memory cells, a read reference biasing voltage level is transferred to the word line of the selected EEPROM configured nonvolatile memory cells. A read reference biasing voltage level is transferred to the word lines of the word lines of the unselected EEPROM configured nonvolatile memory cells in the selected and unselected blocks. A first read biasing voltage is transferred to the drains of the selected EEPROM configured nonvolatile memory cells and the voltage level of the ground reference voltage source is transferred to the drains of the unselected EEPROM configured nonvolatile memory cells. An activate select gate signal is transferred to the select gate control lines of the selected EEPROM configured nonvolatile memory cells and transfers a deactivate select gate signal to the select gate control lines of the unselected EEPROM configured nonvolatile memory cells. The source lines of the EEPROM configured nonvolatile memory cells are set to the voltage level of the ground reference voltage source. The first read biasing voltage has a voltage level of approximately +1.0V. The read reference biasing voltage level is approximately the voltage level of the power supply voltage source VDD, where power supply voltage source is either 1.8V or 3.0V. The voltage level of the bit lines is pre-charged to the first read voltage level. The pre-charged level of the first read voltage is discharged to approximately 0.0V when the memory cell has been successfully programmed and has a threshold voltage level is less than the upper boundary of the programmed threshold voltage level. If the EEPROM configured nonvolatile memory cells are not successfully programmed, the pre-charged level will be maintained when the threshold voltage of the erased EEPROM configured nonvolatile memory cells is greater than the upper boundary of the programmed threshold voltage level. The activate select gate signal has a voltage level of approximately +5.0V and the deactivate select gate signal has a voltage level of the voltage level of the ground reference voltage source.

For the step of erasing a selected page of the array of EEPROM configured nonvolatile memory cells, a very high positive erase voltage is transferred to the word line of the selected EEPROM configured nonvolatile memory cells and the word lines of the unselected EEPROM configured nonvolatile memory cells of the selected block are set to the ground reference voltage level. A very high negative erase voltage is applied to the selected and unselected select gate control lines. The word lines of the unselected EEPROM configured nonvolatile memory cells are disconnected and allowed to float so that the very high negative erase voltage is coupled from the isolation well of the first impurity type to the word lines of the unselected EEPROM configured nonvolatile memory cells in unselected blocks. The source lines of the EEPROM configured nonvolatile memory cells are set to the very high negative erase voltage level. The very high negative erase voltage is applied to an isolation well of the first impurity type. The voltage levels of the very high positive erase voltage and the very high negative erase voltage are less than approximately the breakdown voltage level of transistors. The voltage level of the very high positive erase voltage is from approximately +8.0V to approximately +10.0V and the voltage level of the very high negative erase voltage is from approximately −10.0V to approximately −8.0V.

For the step of verifying a page erase, a selected page of the array of EEPROM configured nonvolatile memory cells, a voltage level of a lower boundary of an erased threshold voltage level is transferred to the word lines of the selected and unselected EEPROM configured nonvolatile memory cells. A second read biasing voltage is applied to the drains of the selected EEPROM configured nonvolatile memory cells. An activate select gate signal is applied to the select gate control lines of the selected EEPROM configured nonvolatile memory cells and a deactivate select gate signal is applied to the select gate control lines of the unselected EEPROM configured nonvolatile memory cells. The source lines of the EEPROM configured nonvolatile memory cells are set to the voltage level of the ground reference voltage source. The lower boundary of an erased threshold voltage level is approximately +4.0V for the single level cell program. The voltage level of the bit lines is pre-charged to second read biasing voltage that is approximately the voltage level of the power supply voltage source less a threshold voltage of an NMOS transistor wherein the voltage level of the power supply voltage source is either +1.8V or +3.0V. The pre-charged level of the second read biasing voltage is discharged to approximately 0.0V when the memory cell has not been successfully erased and has a threshold voltage level is less than the lower boundary of the erased threshold voltage level. If the EEPROM configured nonvolatile memory cells are erased, the pre-charged level will be maintained when the threshold voltage of the erased EEPROM configured nonvolatile memory cells is greater than the lower boundary of the erased threshold voltage level. The activate select gate signal has a voltage level of approximately +5.0V and the deactivate select gate signal has a voltage level of the voltage level of the ground reference voltage source.

For the step of erasing a selected block of the array of EEPROM configured nonvolatile memory cells, a very high positive erase voltage is applied to all the word lines of the EEPROM configured nonvolatile memory cells of the selected block. A very high negative erase voltage is applied to the selected and unselected select gate control lines. The word lines of the unselected EEPROM configured nonvolatile memory cells of the unselected blocks are disconnected so that the very high negative erase voltage is coupled from the isolation well of the first impurity type to the word lines of the unselected EEPROM configured nonvolatile memory cells in unselected blocks. The source lines of the EEPROM configured nonvolatile memory cells are set to the voltage level of the very high negative erase voltage. The very high negative erase voltage is applied to the isolation well of the first impurity type. The voltage levels of the very high positive erase voltage and the very high negative erase voltage is approximately the breakdown voltage level of transistors. The voltage level of the very high positive erase voltage is from approximately +8.0V to approximately +10.0V and the voltage level of the very high negative erase voltage is from approximately −8.0V to approximately −10.0V.

For the step of verifying a block erase, a voltage level of a lower boundary of an erased threshold voltage level is applied to the word lines of the selected and unselected EEPROM configured nonvolatile memory cells. A second read biasing voltage is applied to the drains of the selected EEPROM configured nonvolatile memory cells. An activate select gate signal is applied to the select gate control lines of the selected EEPROM configured nonvolatile memory cells. The source lines of the EEPROM configured nonvolatile memory cells are set to the voltage level of the ground reference voltage source. The lower boundary of an erased threshold voltage level is approximately +4.0V for the single level cell program. The voltage level of the bit lines are pre-charged to the second read biasing voltage that is approximately the voltage level of the power supply voltage source less a threshold voltage of an NMOS transistor where the voltage level of the power supply voltage source is either +1.8V or +3.0V. The pre-charged level of the second read biasing voltage is discharged to approximately 0.0V when the memory cell has not been successfully erased and has a threshold voltage level is less than the lower boundary of the erased threshold voltage level. If the EEPROM configured nonvolatile memory cells are erased, the pre-charged level will be maintained when the threshold voltage of the erased EEPROM configured nonvolatile memory cells is greater than the lower boundary of the erased threshold voltage level. The activate select gate signal has a voltage level of approximately +5.0V and the deactivate select gate signal has a voltage level of the voltage level of the ground reference voltage source.

For the step of erasing an entire chip containing the array of EEPROM configured nonvolatile memory cells, a very high positive erase voltage is applied to all the word lines of the EEPROM configured nonvolatile memory cells of the entire chip. A very high negative erase voltage is applied to the isolation well of the first impurity type. The very high negative erase voltage is applied to the all the select gate control lines of the EEPROM configured nonvolatile memory cells of the entire chip. The source lines of the EEPROM configured nonvolatile memory cells are set to the very high negative erase voltage level. The voltage levels of the very high positive erase voltage and the very high negative erase voltage is less than approximately the breakdown voltage level of transistors. The voltage level of the very high positive erase voltage is from approximately +8.0V to approximately +10.0V and the voltage level of the very high negative erase voltage is from approximately −8.0V to approximately −10.0V.

For the step verifying erasing an entire chip, the row decoder transfers a voltage level of a lower boundary of an erased threshold voltage level to the word line of the selected and unselected EEPROM configured nonvolatile memory cells. A second read biasing voltage is applied to the drains of the selected EEPROM configured nonvolatile memory cells.

An activate select gate signal is transferred to the select gate control lines of the selected EEPROM configured nonvolatile memory cells. The source lines of the EEPROM configured nonvolatile memory cells are set to the voltage level of the ground reference voltage source. The lower boundary of an erased threshold voltage level is approximately +4.0V for the single level cell program. The voltage level of the bit lines is pre-charged to the second read biasing voltage that is approximately the voltage level of the power supply voltage source less a threshold voltage of an NMOS transistor, where the voltage level of the power supply voltage source is either +1.8V or +3.0V. The pre-charged level of the second read biasing voltage is discharged to approximately 0.0V when the memory cell has not been successfully erased and has a threshold voltage level is less than the lower boundary of the erased threshold voltage level. If the EEPROM configured nonvolatile memory cells are erased, the pre-charged level will be maintained when the threshold voltage of the erased EEPROM configured nonvolatile memory cells is greater than the lower boundary of the erased threshold voltage level. The activate select gate signal has a voltage level of approximately +5.0V.

For the step of programming a selected page of the array of EEPROM configured nonvolatile memory cells, a very high negative program voltage is applied to the word line of the selected EEPROM configured nonvolatile memory cells. A second negative program inhibit voltage is applied to the word lines of the unselected word lines is the selected block and the unselected blocks of the array of EEPROM configured nonvolatile memory cells. A high program select voltage level is applied to the bit lines and thus to the drains of the selected EEPROM configured nonvolatile memory cells that are to be programmed. A low program deselect voltage level is applied to the bit lines and thus to the drains of the selected EEPROM configured nonvolatile memory cells that are not to be programmed. A high positive activate control signal is transferred to the select gate control lines connected to the selected nonvolatile voltage cells and a low deactivate select gate signal is transferred to the select gate control lines connected to the unselected nonvolatile voltage cells to allow them to float. The source lines of the EEPROM configured nonvolatile memory cells are set to the voltage level of the ground reference voltage source. The voltage level of the very high negative program voltage is less than the breakdown voltage level of transistors forming the row decoder. The voltage level of the high negative program voltage is from approximately −8.0V to approximately −10.0V. The high program select voltage is from approximately +8.0V to approximately +10.0V and the low program deselect voltage level is from approximately −2.0V to the voltage level of the ground reference voltage source (0.0V) to avoid programming of the unselected EEPROM configured nonvolatile memory cells.

For the step of verifying a page program, a selected page of the array of EEPROM configured nonvolatile memory cells, a voltage level of an upper boundary of an programmed threshold voltage level is applied to the word line of the selected and unselected EEPROM configured nonvolatile memory cells. A second read biasing voltage is applied to the drains of the selected EEPROM configured nonvolatile memory cells. An activate select gate signal is transferred to the select gate control lines of the selected EEPROM configured nonvolatile memory cells and a deactivate select gate signal is transferred to the select gate control lines of the unselected EEPROM configured nonvolatile memory cells. The source lines of the EEPROM configured nonvolatile memory cells are set to the voltage level of the ground reference voltage source. The upper boundary of an programmed threshold voltage level is approximately +1.0V for the single level cell program. The voltage level of the bit lines is pre-charged to the second read biasing voltage that is approximately the voltage level of the power supply voltage source less a threshold voltage of an NMOS transistor, where the voltage level of the power supply voltage source is either +1.8V or +3.0V. The pre-charged level of the second read biasing voltage is discharged to approximately 0.0V when the memory cell has been successfully programmed and has a threshold voltage level is less than the upper boundary of the programmed threshold voltage level. If the EEPROM configured nonvolatile memory cells are not programmed, the pre-charged level will be maintained when the threshold voltage of the programmed EEPROM configured nonvolatile memory cells is greater than the upper boundary of the threshold voltage level. The activate select gate signal has a voltage level of approximately +5.0V and the deactivate select gate signal has a voltage level of the voltage level of the ground reference voltage source.

BRIEF DESCRIPTION OF THE DRAWINGS

FIG. 1a is schematic diagram of an embodiment of a two floating-gate transistor EEPROM configured memory cell embodying the principles of the present invention.

FIG. 1b is a top plan view of an embodiment of two floating-gate transistor EEPROM configured memory cell embodying the principles of the present invention.

FIG. 1c is a cross sectional cross sectional view of an embodiment of two floating-gate transistor EEPROM configured memory cell embodying the principles of the present invention.

FIG. 11 is a table illustrating the voltage conditions applied to the two floating-gate transistor EEPROM configured memory cells of FIG. 5 incorporated in the nonvolatile memory device embodying the principles of the present invention.

FIG. 12a is a table illustrating the voltage conditions applied to the row decoder of FIG. 6 for the nonvolatile memory device for nonvolatile memory device embodying the principles of the present invention.

FIG. 12b is a table illustrating the voltage conditions applied to the select gate decoder of FIG. 6 for the nonvolatile memory device for nonvolatile memory device embodying the principles of the present invention.

DETAILED DESCRIPTION OF THE INVENTION

Figure 2A:
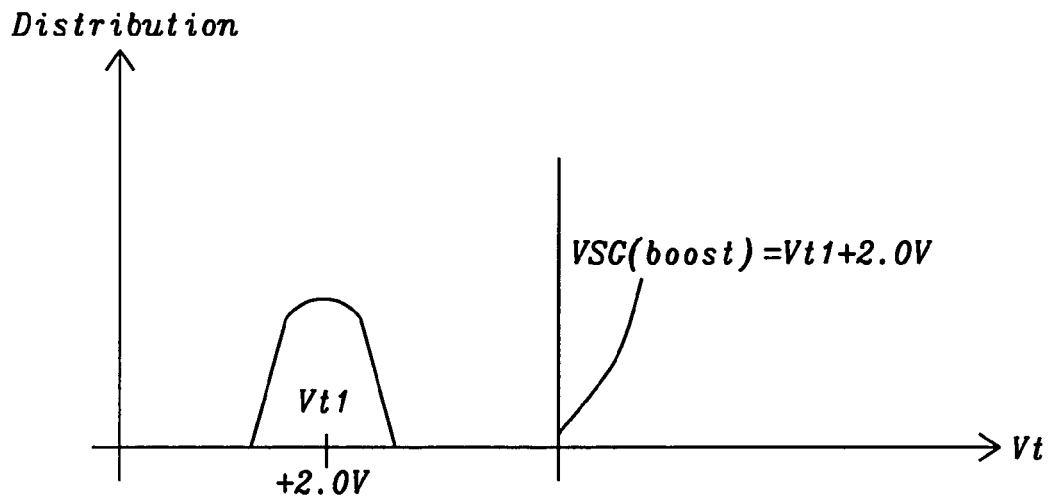
FIG. 2a is a graph of the single threshold voltage distribution of a floating gate select transistor of a two floating-gate transistor EEPROM configured memory cell having a single threshold voltage level embodying the principles of the present invention.

FIG. 1a is schematic diagram of an embodiment of a two floating-gate transistor EEPROM configured memory cell 5. FIG. 1b is a top plan view of an embodiment of two floating-gate transistor EEPROM configured memory cell 5. FIG. 1c is a cross sectional cross sectional view of an embodiment of two floating-gate transistor EEPROM configured memory cell 5. The two floating-gate transistor EEPROM configured memory cell 5 is formed in the top surface of a P-type substrate 10. An N-type material is diffused into the surface of the P-type substrate 10 to form a deep N-well 15. A P-type material is then diffused into the surface of the deep N-well 15 to form a P-well 20 (commonly referred to as a triple P-well—TPW). The N-type material is then diffused into the surface of a P-type well TPW 20 to form the drain region (D) 31 of the NMOS floating-gate select transistor 30, the source region of the floating gate select transistor 30 and the source/drain regions (S/D) 55. The source/drain region 55 is the source region of the floating gate select transistor 30 and the drain region for the floating gate memory transistor 25. A first polycrystalline silicon layer is formed above the bulk region of the P-type well 20 between the drain region 31 and the source/drain region 55 of the NMOS floating-gate select transistor 30 to form the floating gate 32. The first polycrystalline layer is also formed above the bulk region between the source/drain region 55 and the source region 29 to form the floating gate 27 of the floating gate memory transistor 25. A second polycrystalline silicon layer is formed over the floating gates 27 and 32 to create the control gates 28 and 33 of the floating gate memory transistor 25 and the floating-gate select transistor 30. The source/drain regions 55 is formed between the adjacent second polycrystalline silicon layers of control gates 28 and 33 of the floating gate memory transistor 25 and the floating-gate select transistor 30. The source region 29 of the floating gate memory transistor 25 is shown as a half source region in that the whole source region 29 is shared with the source region of an adjacent two floating-gate transistor EEPROM configured memory cell 5 in an array. The self-aligned source/drain regions 29 are commonly used in the floating gate memory transistor 25 to reduce the source line pitch.

In an array, multiple two floating-gate transistor EEPROM configured memory cells 5 are arranged in a matrix of rows and columns. The control gate 28 of the floating gate memory transistors 25 is extended to form a word line 35 that connects to each of the floating gate memory transistor 25 on a row of the array. The control gate 33 of the NMOS floating-gate select transistor 30 is connected to receive the select gating signal 40 at the drain 31. A P+-contact 21 connects a P-well TPW 20 to the P-well voltage source 70, the N+-contact 16 is connected to the deep N-well voltage source 65, and the P+-contact 11 is connected to the P-substrate voltage source 60. In most embodiments P-substrate voltage source 60 is actually the ground reference voltage source.

Figure 2B:
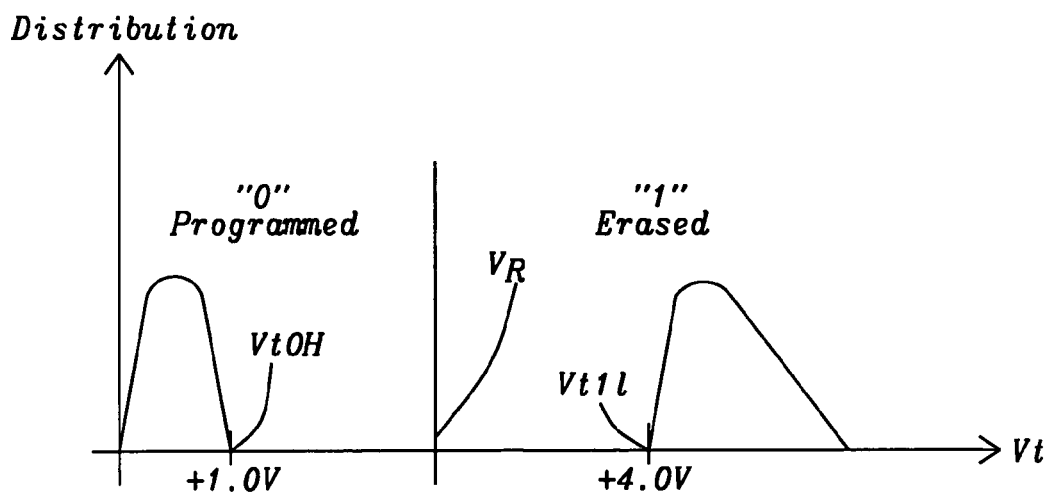
FIG. 2b is a graph of two threshold voltage distributions of two floating-gate transistor EEPROM configured memory cell having a single positive program level and a positive erase level.

FIGS. 2a and 2b are graphs of threshold voltage levels of various embodiments of a two floating-gate transistor EEPROM configured memory cell with a floating gate memory transistor 25 and a floating-gate select transistor 30 of FIG. 1a. FIG. 2a illustrates the voltage thresholds levels the NMOS floating-gate select transistor 30. The floating-gate select transistor 30 has a positive threshold voltage that is nominally approximately +2.0V. The voltage level applied to the select gating signal 40 must be greater than the select gating voltage VSG (boosted) to insure that the floating-gate select transistor 30 will turn on. The select gating voltage VSG (boosted) is set to a voltage level that is approximately +2.0V greater than the positive threshold voltage Vt1 of the floating-gate select transistor 30. The select gating voltage VSG (boosted) will be discussed in more detail hereinafter for the read operation, the program operation, the program verify operation, the erase operation (page, block, and chip), and the erase verify operation.

FIG. 2b illustrates the voltage thresholds levels for programming and erasing of the floating gate memory transistor 25. There is a positive programmed threshold voltage level (Vt1) representing a logical "0" datum and one positive erased threshold voltage level (Vt0) representing a logical "1" datum. The programmed threshold voltage level (Vt1) is established through a Fowler-Nordheim edge tunneling effect and the erased threshold voltage level (Vt0) is established through a Fowler-Nordheim channel tunneling effect. An upper boundary of the threshold voltage Vt0H for programming of the floating gate memory transistor 25 with an voltage level of approximately +1.0 V to activate the Fowler-Nordheim edge tunneling effect. A lower boundary of the threshold voltage Vt1L for erasing the floating gate memory transistor is approximately +4.0V to activate the Fowler-Nordheim channel tunneling effect.

FIGS. 3a-3d are simplified schematic diagrams of an array of a two floating-gate transistor EEPROM configured memory cells 110a, . . . , 110m illustrating the bias conditions for reading, programming, page erasing and chip erasing of two floating-gate transistor EEPROM configured memory cell embodying the principles of the present invention. The EEPROM configured memory cells 110a, . . . , 110m are arranged in rows and columns to form an array. The schematic diagrams of FIGS. 3a-3d are simplified to show a single column of the array of EEPROM configured memory cells 110a, . . . , 110m. Each of the EEPROM configured memory cells 110a, . . . , 110m has a floating gate select transistor 115a, . . . , 115m and a floating-gate memory transistor 120a, . . . , 120m. The drains of the floating gate memory transistors 120a, . . . , 120m and the source of floating-gate select transistors 115a, . . . , 115m are connected together. The drains of the floating gate select transistors 115a, . . . , 115m on each column are commonly connected to the bit line 140. The control gates of each of the floating gate memory transistors 120*a*, . . . , 120*m* on each row are commonly connected to one of a word lines 125*a*, . . . , 125*m* The sources of the floating-gate memory transistors 120*a*, . . . , 120*m* on each row of the array are commonly connected to the source lines 135*a*, . . . , 135*m*. The gates of the floating-gate select transistors 115*a*, . . . , 115*m* are connected to the select gate lines 130*a*, . . . , 130*m*. The array 100 of the EEPROM configured memory cells 110*a*, . . . , 110*m* are formed in a single P-type well TPW 105.

The word lines 125*a*, . . . , 125*m* are connected to a row decoder that decodes a block and row address and applies the appropriate voltages to the word lines 125*a*, . . . , 125*m* for reading, programming, and erasing selected EEPROM configured memory cells 110*a*, . . . , 110*m* of the array 100. The select gate lines 130*a*, . . . , 130*m* are connected to a select gate decoder that decodes a block and row address and applies to the appropriate voltage levels to the source lines select gate lines 130*a*, . . . , 130*m* for reading, programming, and erasing selected EEPROM configured memory cells 110*a*, . . . , 110*m* of the array 100. The bit line 140 is connected to a pass gate and sense amplifier that decodes a column address and applies the appropriate biasing voltages for reading, programming, and erasing selected EEPROM configured memory cells 110*a*, . . . , 110*m* of the array 100. The bit line 140 is representative of multiple bit lines in a much larger array of EEPROM configured memory cells 110*a*, . . . , 110*m*. The P-type well TPW 105 and the source lines 135*a*, . . . , 135*m* are connected to be appropriately biased for reading, programming, and erasing selected EEPROM configured memory cells 110*a*, . . . , 110*m* of the array 100.

Figure 3A:
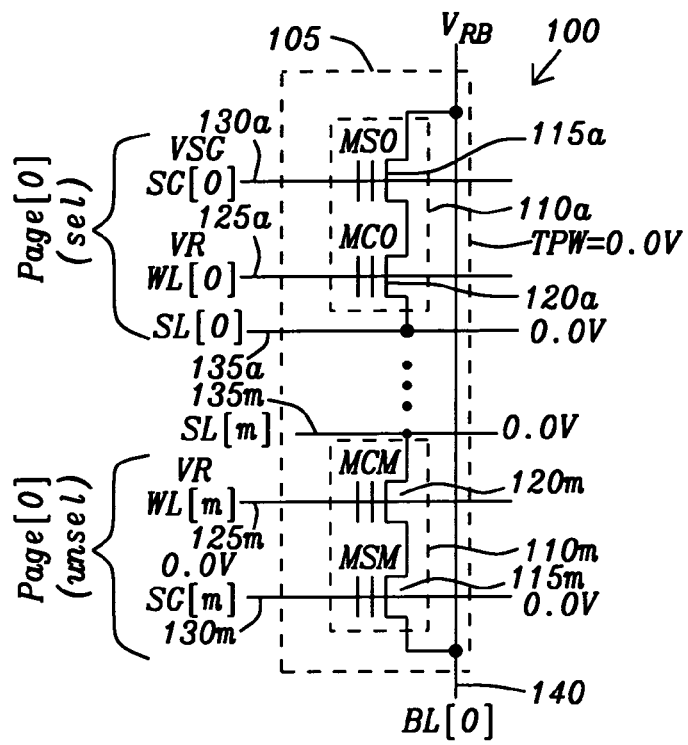
FIGS. 3a-3d are simplified schematic diagrams of an array of two floating-gate transistor EEPROM configured memory cells illustrating the bias conditions for reading, programming, page erasing and chip erasing of two floating-gate transistor EEPROM configured memory cell embodying the principles of the present invention.

FIG. 3*a* illustrates the biasing voltages for reading data from selected EEPROM configured memory cells 110*a*, . . . , 110*m* of the array 100. The word line 125*a*, which is connected to the selected page having the selected EEPROM configured memory cell 110*a* containing the selected floating gate memory transistor 120*a*, is set to the voltage level of the read voltage threshold VR or approximately the level of the power supply voltage source VDD. The power supply voltage source VDD is either 1.8V or 3.0V. The unselected word line 125*m*, which is connected to the unselected page having the selected EEPROM configured memory cell 110*m* containing the unselected floating gate memory transistor 120*m*, is set to the voltage level of the read voltage threshold VR. The select gate line 130*a* connected to the selected floating-gate select transistor 115*a* is set to the voltage level select gating voltage VSG that is approximately +4.0V. The select gate line 130*m*, which is connected to the unselected page having the selected EEPROM configured memory cell 110*m* containing the unselected floating gate memory transistor 115*m*, is set to a first select gate inhibit biasing voltage that is approximately the voltage level of the ground reference voltage source. The bit line BL[0] 140 is set to the first read voltage VRB of approximately +1.0V. The P-type well TPW 105 and the source lines 135*a*, . . . , 135*m* are set to the voltage level of the ground reference voltage source (0.0). The bit line BL[0] 140 is pre-charged to the voltage level of the first read voltage VRB of approximately the 1.0V. The pre-charged level of the first read voltage VRB is discharged to approximately 0.0V when the selected EEPROM configured memory cell 110*a* has been programmed and has a threshold voltage level less than the upper boundary of the programmed threshold voltage level. If the selected EEPROM configured memory cell 110*a* is erased, the pre-charged level will be maintained when the threshold voltage of the selected EEPROM configured memory cell 110*a* is greater than the lower boundary erased threshold voltage level of approximately +4.0V. If the selected floating gate memory transistor 120*a* is erased as a logical "1", the selected NMOS floating gate memory transistor 120*a* will not turn on and a sense amplifier will detect the programmed level of the logical "1". Alternately, if the selected floating gate memory transistor 120*a* is programmed with a logical "0", the selected floating gate memory transistor 120*a* will turn on and a sense amplifier will detect the programmed level of the logical "0".

Figure 3B:
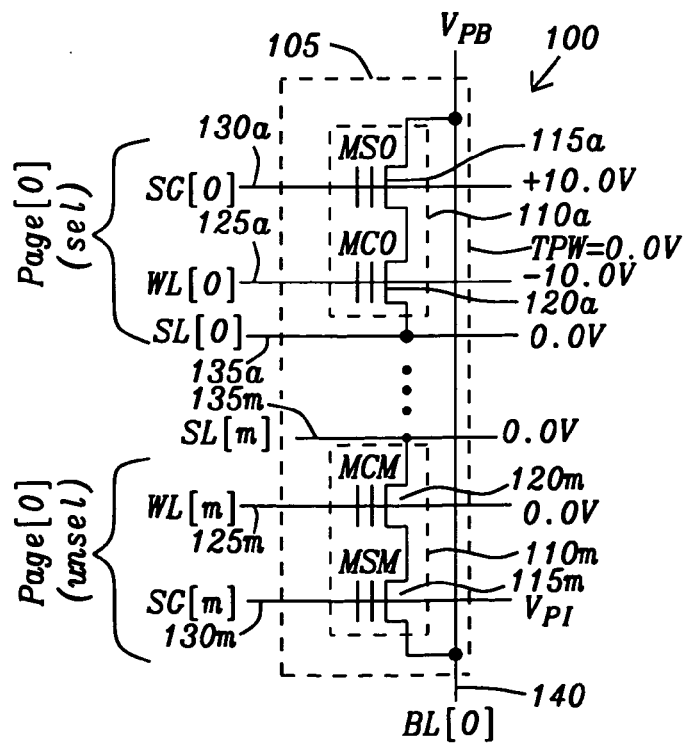

FIG. 3*b* illustrates the biasing voltages for programming data to selected EEPROM configured memory cells 110*a*, . . . , 110*m* of the array 100. The word line 125*a*, which is connected to the selected page having the selected EEPROM configured memory cell 110*a* containing the selected floating gate memory transistor 115*a*, is set to the voltage level of a very high negative programming voltage level of from approximately −10.0V to approximately −8.0V. The unselected word line 125*m*, which is connected to the unselected page containing the unselected floating gate memory transistor 120*m*, is disconnected to be floating. The select gate line 130*a* connected to the selected floating gate memory transistor 120*a* is set to a voltage level of a very high positive voltage that is from approximately +8.0V to approximately +10.0V. The select gate line 130*m*, which is connected to the unselected page having the unselected floating-gate select transistor 115*m*, is set to a program inhibit voltage level $V_{PL}$ that is approximately either a voltage level of approximate +2.0v or the voltage level of the ground reference voltage source (0.0V). The P-type well TPW 105 and the source lines 135*a*, . . . , 135*m* are set to the voltage level of the ground reference voltage source (0.0). If the selected floating gate memory transistor 120*a* is to remain erased as a logical "1", the bit line BL[0]140 connected to the selected NMOS floating gate memory transistor 120*a* will be set to a program biasing drain voltage $V_{PB}$ of approximately the ground reference voltage. Alternately, if the selected floating gate memory transistor 120*a* is to be programmed with a logical "0", the bit line BL[0] 140 connected to the selected floating gate memory transistor 120*a* is set to the program biasing drain voltage $V_{PB}$ of approximately +5.0V.

Figure 3C:
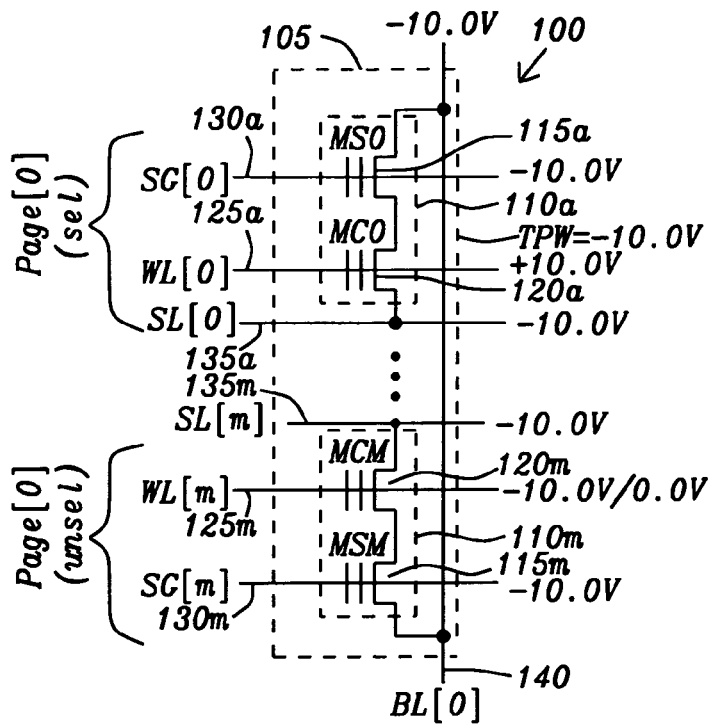

FIG. 3*c* illustrates the biasing voltages for erasing a page of data from selected EEPROM configured memory cells 110*a*, . . . , 110*m* of the array 100. The word line 125*a*, which is connected to the selected page having the selected EEPROM configured memory cell 110*a* containing the selected floating gate memory transistor 120*a*, is set to the voltage level of a very high positive erasing voltage level of from approximately +8.0V to approximately +10.0V. The unselected word line 125*m*, which is connected to unselected pages of the selected block containing an unselected floating gate memory transistor 120*m*, is set to the voltage level of approximately the ground reference voltage source. The unselected word line 125*m*, which is connected to unselected pages of an unselected block containing an unselected floating gate memory transistor 120*m*, is set to the very high negative erasing voltage level of from approximately −10.0V to approximately −8.0V. The select gate lines 130*a*, . . . , 130*m* are set to the very high negative erasing voltage level of from approximately −10.0V to approximately −8.0V. The bit line BL[0] 140, the P-type well TPW 105, and the source lines 135*a*, . . . , 135*m* are set to the very high negative erasing voltage level of from approximately −10.0V to approximately −8.0V.

The approximately 16.0 V to 20.0 V voltage difference between the very high positive erasing voltage level at the control gate of the selected floating gate memory transistor 120*a* and very high negative erasing voltage level at the P-type well TPW 105 induces the Fowler-Nordheim channel tunneling phenomena that attracts electrons into the floating-gate of the selected floating gate memory transistor 120a in the selected page. As a consequence, the threshold voltage of the selected floating gate memory transistor is increased. After about 500 µS, the threshold voltage would be increased to be greater than lower boundary of the erased threshold voltage level Vt1L of approximately 4.0V. The bias conditions as shown, prevent the floating gate memory transistors 120m in the unselected pages from being effected during the erase operation. After a page erase operation, an erase verification operation is executed to insure that the desired erased threshold voltage level Vt1L of approximately 4.0V is achieved.

Figure 3D:
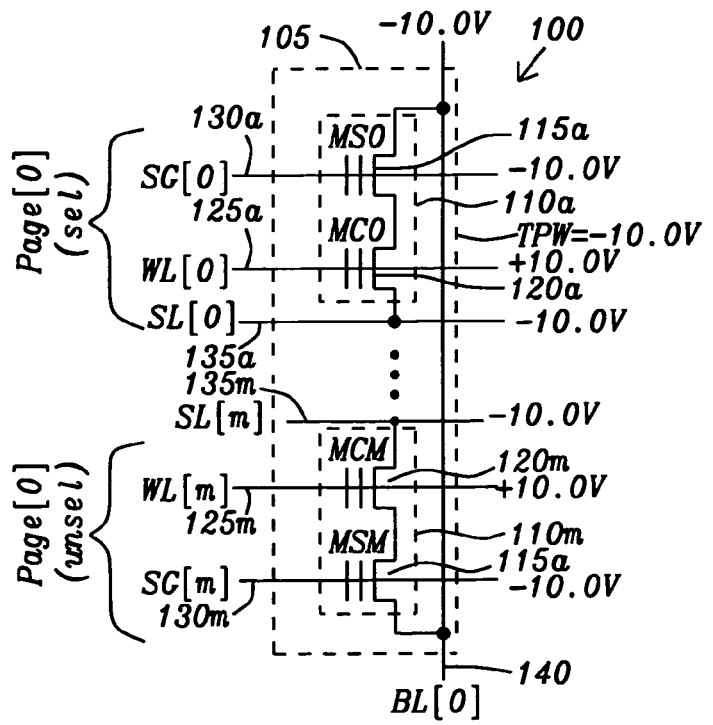

FIG. 3d illustrates the biasing voltages for erasing an entire chip of data from selected EEPROM configured memory cells 110a, . . . , 110m of the array 100. All the word lines 125a, . . . , 125m of the chip containing the all the floating gate memory transistor 120a, . . . , 120m are selected and set to the voltage level of a very high positive erasing voltage level of from approximately +8.0V to approximately +10.0V. The select gate lines 130a, . . . , 130m are connected are set to the very high negative erasing voltage level of from approximately −10.0V to approximately −8.0V. The bit line 140, the P-type well TPW 105, and the source lines 135a, . . . , 135m are set to the very high negative erasing voltage level of from approximately −10.0V to approximately −8.0V.

As described, the approximately 16.0 V to 20.0 V voltage difference between the very high positive erasing voltage level at the control gate of all the floating gate memory transistors 120a, . . . , 120m and very high negative erasing voltage level at the P-type well TPW 105 induces the Fowler-Nordheim channel tunneling phenomena that attracts electrons into the floating-gate of the selected floating gate memory transistors 120a, . . . , 120m in the chip. As a consequence, the threshold voltage of the floating gate memory transistors 120a, . . . , 120m is increased. After about 500 µS, the threshold voltage would be increased to be greater than lower boundary of the erased threshold voltage level Vt1L of approximately +4.0V.

Figure 4:
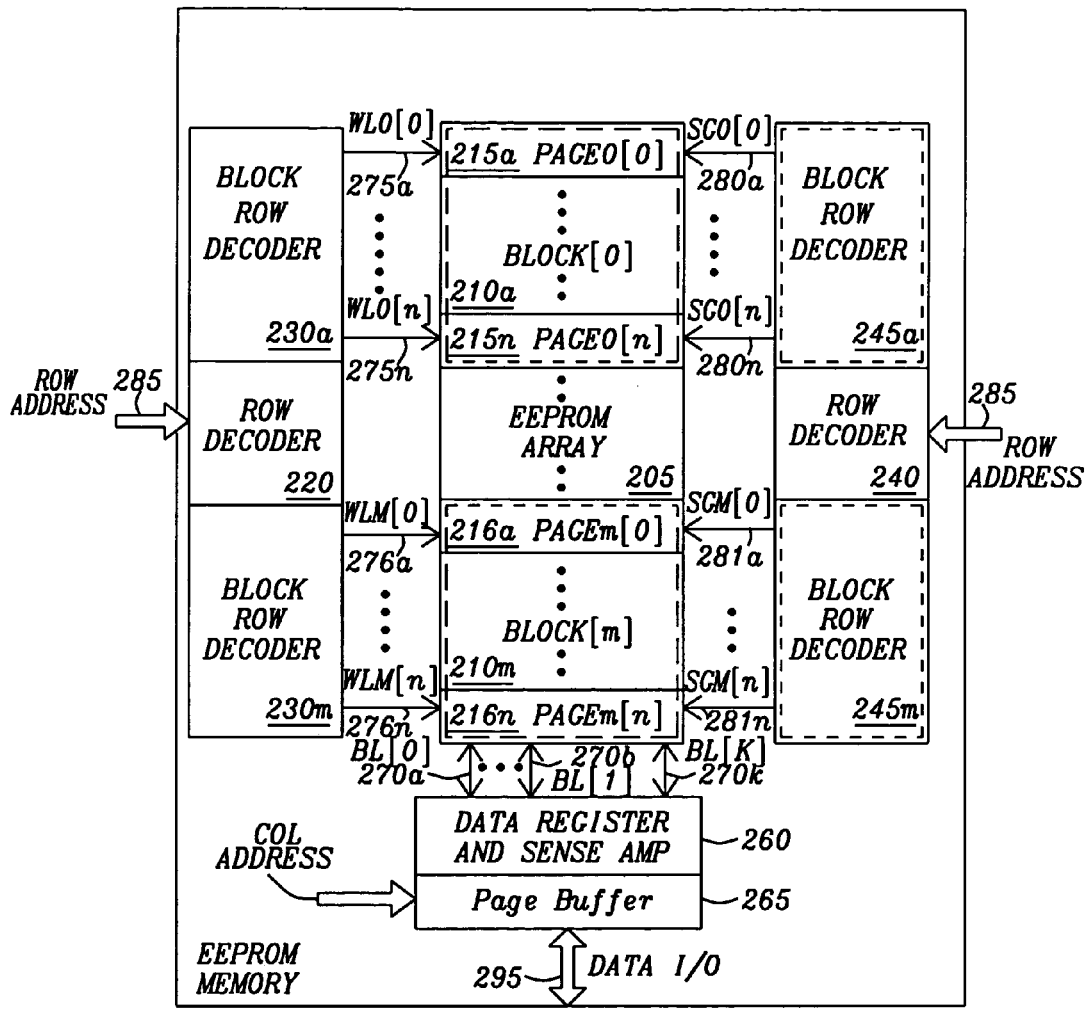
FIG. 4 is a block diagram of a nonvolatile memory device embodying the principles of the present invention.

FIG. 4 is a block diagram of a nonvolatile memory device 200 embodying the principles of the present invention incorporating the various embodiments of EEPROM configured memory cells of the present invention. The EEPROM nonvolatile memory device 200 includes an array 205 of EEPROM configured memory cells arranged in a matrix of rows and columns. The array 205 is partitioned into a uniform number of blocks 210a, . . . , 210m and each block is divided into a uniform number of pages 215a, 215b, . . . , 215n, and 216a, 216b, . . . , 216n, For instance, a 1 Mb memory array device may be divided into 128 blocks. Each block then becomes 8 KB and may be divided into a number of pages such as 8 pages of 1 KB each. Further, the block is divided into pages. In this example, the page may have a size of 4 Kb such that one page is equivalent to one word line or row of the block or sub-array 215a, 215b, . . . , 215n, and 216a, 216b, . . . , 216n. Thus, each block 215a, 215b, . . . , 215n, and 216a, 216b, . . . , 216n has 8 pages or word lines.

The column address decoder 265 receives a column address 290, decodes the column address 290, and from the decoded column address 290 selects which columns of the array are being accessed. The data register and sense amplifier 260 activates the appropriate bit lines 270a, . . . , 270k for operating a selected block 210a, . . . , 210m. The appropriate bit lines 270a, . . . , 270k are further connected to the column address decoder 265. The data register and sense amplifier 260 receives the data signals through the bit lines 270a, . . . , 270k from the selected block 210a, . . . , 210m and senses and holds the data from the data signal for a read operation. In a program operation, the data is transferred from the data register and sense amplifier 260 through the bit lines 270a, . . . , 270k to the selected block 210a, . . . , 210m. The data being read from or written (program and erase) to the array 205 of EEPROM configured memory cells is transferred to and from the data register and sense amplifier 260 through the column address decoder 265 from and to the data input/output bus 295.

Each block 215a, 215b, . . . , 215n, and 216a, 216b, . . . , 216n of the array 205 of EEPROM configured memory cells is connected to a row decoder 220 through the word lines 275a, 275b, . . . , 275n, 276a, 276b, . . . , 276n. Each block 210a, . . . , 210m is connected to a block row decoder 230a, . . . , 230m within the row decoder 220 for providing the appropriate voltage levels to a selected page or word line for reading and programming selected EEPROM configured memory cells. The row address 285 is transferred to each of the block row decoders 230a, 230b, . . . , 230n to select the page or word line and to provide the appropriate voltage levels for reading and programming the selected EEPROM configured memory cells.

Each block 215a, 215b, . . . , 215n, and 216a, 216b, . . . , 216n of the array 205 of EEPROM configured memory cells is connected to a select gate decoder 240 through the select gate lines 280a, 280b, . . . , 280n and 281a, 281b, . . . , 281n. The select gate decoder 240 is formed of multiple blocks of select gate decoders 245a, . . . , 245m. Each block 215a, 215b, . . . , 215n, and 216a, 216b, . . . , 216n is connected with its own select gate line decoder 245a, . . . , 245m for providing the appropriate voltage levels to selected gate lines of a selected page for reading and programming selected EEPROM configured memory cells. The row address 285 is transferred to each of the block select gate line decoders 245a, 245b, . . . , 245m to select the select gate line of the selected page to provide the appropriate voltage levels for reading, programming, and erasing the selected EEPROM configured memory cells.

Figure 5:
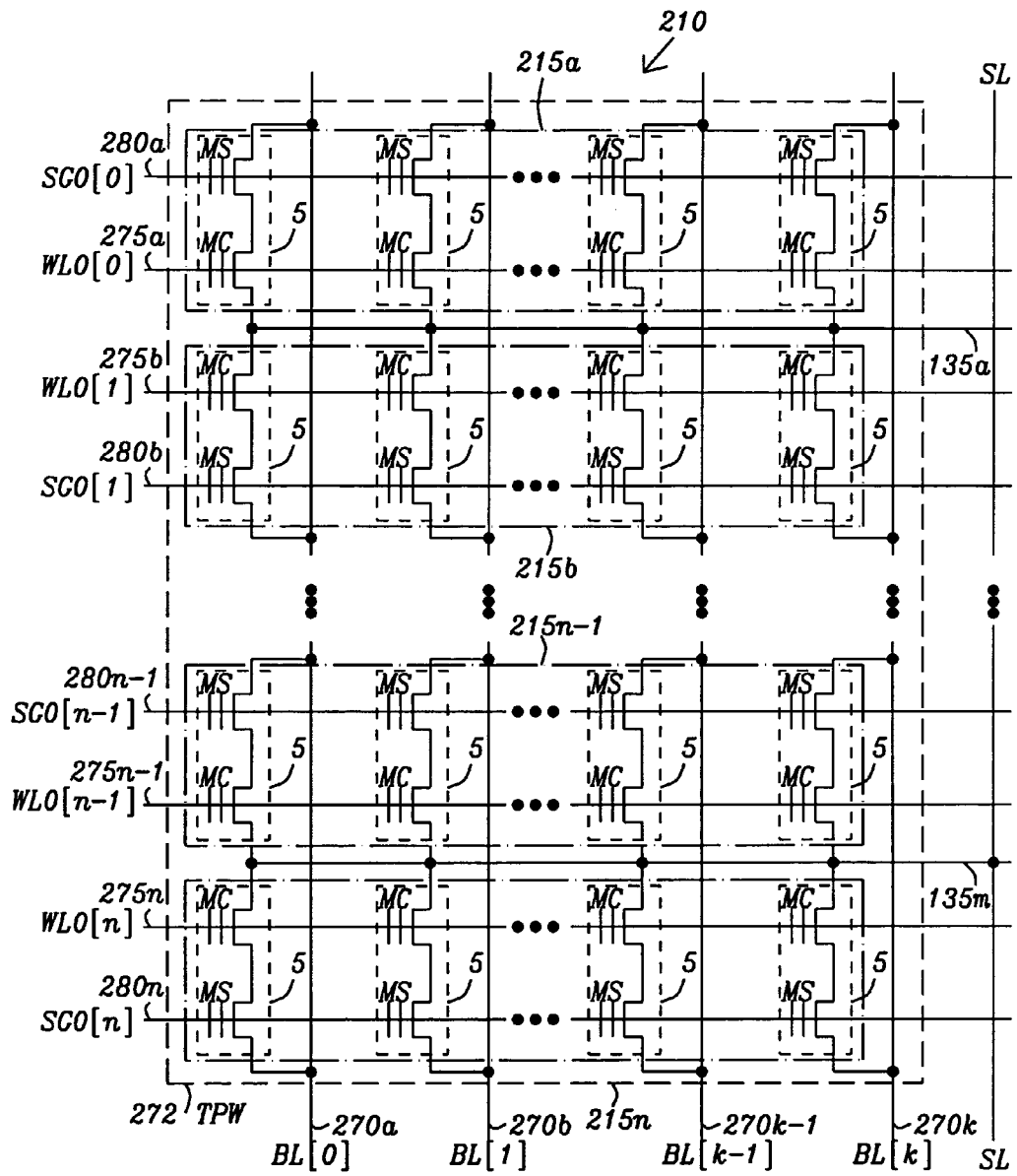
FIG. 5 is a schematic diagram illustrating an array of two floating-gate transistor EEPROM configured memory cells of FIG. 4 embodying the principles of the present invention.

Refer now to FIG. 5 for a discussion of the structure of a block 210 of the array 205 of FIG. 4. The block 210 is exemplary of the all the blocks 210a, . . . , 210m of array 205. The block 210 is placed in a common P-type well TPW 212 and contains all the EEPROM configured memory cells 5 of the block 210. The EEPROM configured memory cells 5 are arranged in rows and columns to form the sub-array of the block 210. Each of the EEPROM configured memory cells 5 are formed of a floating-gate memory transistor MC and a floating-gate select transistor MS. The floating-gate select transistor MS of the EEPROM configured memory cells 5 have their drains commonly connected to a bit line 270a, . . . , 270k associated with a column on which the EEPROM configured memory cells 5 are placed. The source of the floating-gate select transistor MS is commonly connected to the drain of the floating-gate memory transistor MC. The sources of the floating-gate memory transistors MC of adjacent pairs of rows of the EEPROM configured memory cells 5 are connected to one source line 135a, . . . , 135m. The source lines 135a, . . . , 135m are connected externally to the array to receive the appropriate source biasing voltages for reading, programming, and erasing selected EEPROM configured memory cells 5. The control gates of the floating-gate memory transistors MC are connected to the word lines 275a, . . . , 275m. The word lines 275a, . . . , 275m are connected to the row decoder 220 of FIG. 4. The block 210 divided into pages 215a, . . . , 215m. The page 215a, . . . , 215m being groupings of the EEPROM configured memory cells 5 having their control gates connected commonly to a word line (WL0) of the word lines 275a, . . . , 275m. The control gates of the floating-gate select transistors MS are connected to the select gate lines 280a, . . . , 280m. The select gate lines 280a, . . . , 280m are commonly connected to the select gate decoder 240 of FIG. 4 to received the activation signals to turn on the selected floating-gate select transistors MS for reading, programming, erasing and verifying selected floating-gate memory transistors MC.

Figure 6A:
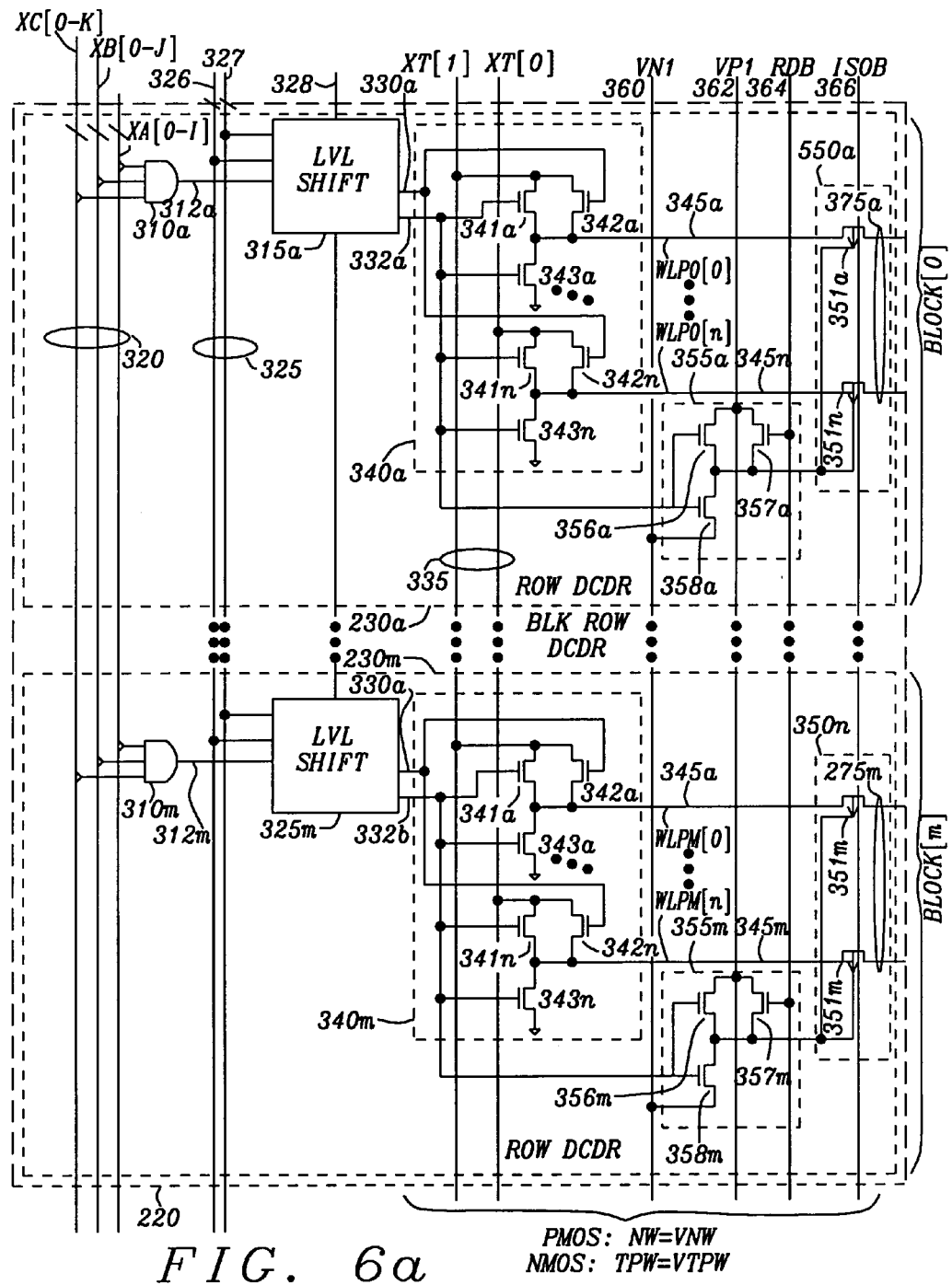
FIG. 6a is a schematic diagram of a block row decoder of the nonvolatile memory device of FIG. 4 embodying the principles of the present invention.

FIG. 6a is a schematic diagram of a representative row decoder 220 of the nonvolatile memory device of FIG. 4. Each row decoder 220 is partitioned into block decoders 230a, . . . , 230m. The number of block decoders 230a, . . . , 230m in each row decoder 220 is equal to the number of blocks 210a, . . . , 210m of FIG. 4. the logic gate 310a, . . . , 310m (an AND gate in this embodiment) receives the block address 320 of the row address 285 of FIG. 4, decodes the block address 320 to select which of the block row decoders 230a, . . . , 230m is to be activated for reading, programming, or erasing. The output of the logic gate 310a, . . . , 310m is the block select signal RXD [0] 312a, . . . , RXD [m] 312m that is the input to an input to the level shift circuit 315a, . . . , 315m. The level shift circuit 315a, . . . , 315m receives the power supply voltage levels 325 that are used to shift the lower voltage logic level of the block select signal RXD [0] 312a, . . . , RXD [m] 312m to the levels required for reading, programming, and erasing. The outputs of the level shift circuit 315a, . . . , 315m are the high voltage block select signals XD 330a, . . . , 330m and XDB 332a, . . . , 332m that are applied to the row decode circuit 340a, . . . , 340m.

The row decode circuits 340a, . . . , 340m provide the appropriate voltage levels for transfer to the rows of the word lines 275a, . . . , 275m of the selected block 210a, . . . , 210m of FIG. 4. The voltage levels applied to row decode circuit 340a, . . . , 340m are provided by the high voltage power supply voltage lines 335. Each high voltage power supply voltage lines XT[0:1] 335 is associated with one of the word lines 275a, . . . , 275m and is set according to the operation (read, program, erase, or verify) to be executed and are discussed hereinafter. The row decode circuits 340a, . . . , 340m have the row pass devices formed of the high voltage PMOS transistors 341a, . . . , 341m and the high voltage NMOS transistors 342a, . . . , 342m connected pair-wise in parallel. The gates of the PMOS transistors 341a, . . . , 341m are each connected to one of the high voltage out of phase block select signals XDB 332a, . . . , 332m. The gates of the NMOS transistors 342a, . . . , 342m are each connected to one of the in-phase block select signals XD 330a, . . . , 330m. The sources of the PMOS transistors 341a, . . . , 341m and the drains of the NMOS transistors 342a, . . . , 342m are connected to the high voltage power supply voltage lines XT[0:1] 335 associated with one of the word lines 275a, . . . , 275m. The drains of the PMOS transistors 341a, . . . , 341m and the sources of the NMOS transistors 342a, . . . , 342m are connected to the drain high voltage pass transistors 343a, . . . , 343m associated with one of the word lines 275a, . . . , 275m. The drains of the PMOS transistors 341a, . . . , 341m and the sources of the NMOS transistors 342a, . . . , 342m are further connected to the drain of the NMOS transistors 343a, . . . , 343m. The gate of the NMOS transistors 343a, . . . , 343m is connected to the out of phase block select signals XDB 332a, . . . , 332m and the sources of the NMOS transistors 343a, . . . , 343m are connected to the ground reference voltage source (0.0). For the row decoders 230a, . . . , 230m of the unselected block 210a, . . . , 210m, the level shift circuit 315a, . . . , 315m are deactivated and the out of phase block select signals XDB 332a, . . . , 332m are set to turn on the NMOS transistors 343a, . . . , 343m to set the drains of the NMOS transistors 343a, . . . , 343m to the voltage level of the ground reference voltage source (0.0).

The high voltage pass transistors 351a, . . . , 351m form the PMOS high voltage isolators 350a, . . . , 350m. The gates of the high voltage pass transistors 351a, . . . , 351m are connected together and to the isolation signal ISOB 366. When activated, the high voltage pass transistors 351a, . . . , 351m connect the word lines 275a, . . . , 275m to the row decode circuits 340a, . . . , 340m through the word line biasing lines 345a, . . . , 345m. When deactivated, the high voltage pass transistors 351a, . . . , 351m isolate the word lines 275a, . . . , 275m to the row decode circuits 340a, . . . , 340m.

The PMOS high voltage isolators 350a, . . . , 350m are each formed in an independent N-type well 352a, . . . , 352m. The N-type well 352a, . . . , 352m for each of the N-type well 352a, . . . , 352m is connected to an N-type well switch 355a, . . . , 355m to individually charge or discharge the N-type wells 352a, . . . , 352m. The N-type well switch 355a, . . . , 355m includes the PMOS transistors 356a, . . . , 356m and 357a, . . . , 357m and the NMOS transistor 358a, . . . , 358m. The gates of the PMOS transistors 356a, . . . , 356m and the NMOS transistors 358a, . . . , 358m are connected to the out of phase block select signals XDB 332a, . . . , 332m. The gates of the PMOS transistors 357a, . . . , 357m are connected to the out of phase read signal RDB 364. The drains the PMOS transistors 356a, . . . , 356m and 357a, . . . , 357m and drains the NMOS transistors 358a, . . . , 358m are connected to the N-type wells 352a, . . . , 352m. The sources of the PMOS transistors 356a, . . . , 356m and 357a, . . . , 357m are connected to the positive N-well biasing voltage source VP1 362 and the sources of the NMOS transistors 358a, . . . , 358m are connected to the negative N-well biasing voltage source VM1 360.

Figure 6B:
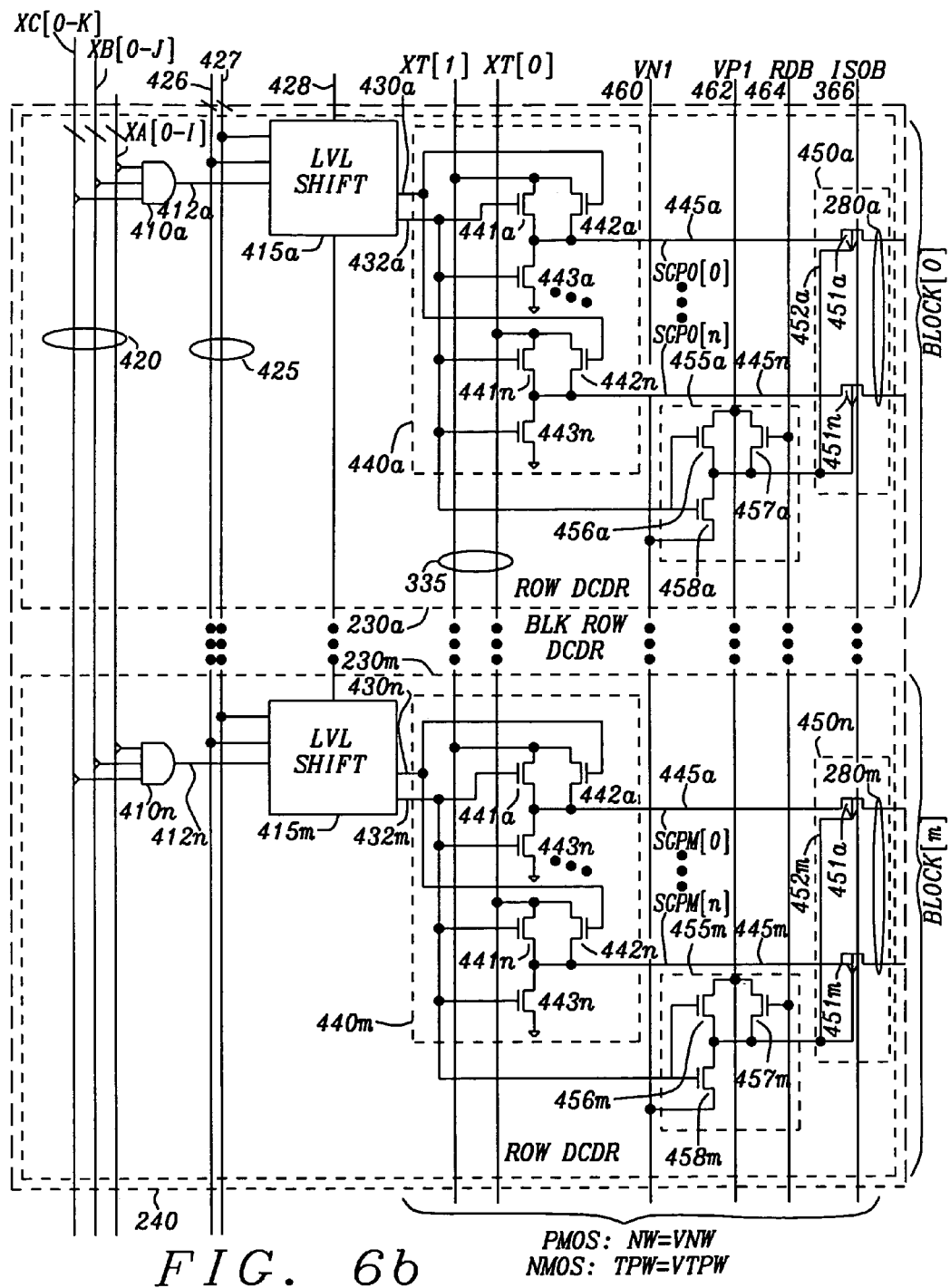
FIG. 6b is a schematic diagram of select gate decoder of the nonvolatile memory device of FIG. 4 embodying the principles of the present invention.

FIG. 6b is a schematic diagram of select gate decoder 240 of the nonvolatile memory device of FIG. 4. Each select gate decoder 240 is partitioned into a block select gate decoders 245a, 245b, . . . , 245m. The number of block select gate decoders 245a, 245b, . . . , 245m in each select gate decoder 425 is equal to the number blocks 210a, . . . , 210m in the array 205 of FIG. 4. The logic gate 410a, . . . , 410m (an AND gate in this embodiment) receives the block address 420 of the row address 285 of FIG. 4, decodes the block address 420 to select which of the block select gate decoders 245a, . . . , 245m is to be activated for reading, programming, or erasing. The output of the logic gate 410a, . . . , 410m is the block select signal RXD [0] 412a, . . . , RXD [m] 412m that is the input to an input to the level shift circuit 415a, . . . , 415m. The level shift circuit 415a, . . . , 415m receives the power supply voltage levels 425 that are used to shift the lower voltage logic level of the block select signal RXD [0] 412a, . . . , RXD [m] 412m to the levels required for reading, programming, and erasing. The outputs of the level shift circuit 415a, . . . , 415m are the high voltage block select signals XD 330a, . . . , 330m and XDB 432a, . . . , 432m that are applied to the row decode circuit 440a, . . . , 440m.

The row decode circuits 440a, . . . , 440m provide the appropriate voltage levels for transfer to the rows of the select gate lines 280a, . . . , 280m of the selected block 210a, . . . , 210m of FIG. 4. The voltage levels applied to row decode circuit 440a, . . . , 440m are provided by the high voltage power supply voltage lines 435. Each high voltage power supply voltage lines 435 is associated with one of the select gate lines 280a, . . . , 280m and is set according to the operation (read, program, erase, or verify) to be executed and are discussed hereinafter. Each of the row decode circuits 440a, . . . , 440m have the row pass devices formed of the high voltage PMOS transistors 441a, . . . , 441m and the high voltage NMOS transistors 442a, ..., 442m connected pairwise in parallel. The gates of the PMOS transistors 441a, ..., 441m are each connected to one of the high voltage out of phase block select signals XDB 432a, ..., 432m. The gates of the NMOS transistors 442a, ..., 442m are each connected to one of the in-phase block select signals XD 330a, ..., 330m. The sources of the PMOS transistors 441a, ..., 441m and the drains of the NMOS transistors 442a, ..., 442m are connected to the high voltage power supply voltage line 435 associated with one of the select gate lines 280a, ..., 280m. The drains of the PMOS transistors 441a, ..., 441m and the sources of the NMOS transistors 442a, ..., 442m are connected to the drain high voltage pass transistors 443a, ..., 443m associated with one of the select gate lines 280a, ..., 280m. The drains of the PMOS transistors 441a, ..., 441m and the sources of the NMOS transistors 442a, ..., 442m are further connected to the drain of the NMOS transistors 443a, ..., 443m. The gate of the NMOS transistors 443a, ..., 443m is connected to the out of phase block select signals XDB 432a, ..., 432m and the sources of the NMOS transistors 443a, ..., 443m are connected to the ground reference voltage source (0.0). For the select gate decoders 245a, ..., 245m of the unselected block 210a, ..., 210m, the level shift circuit 415a, ..., 415m are deactivated and the out of phase block select signals XDB 432a, ..., 432m are set to turn on the NMOS transistors 443a, ..., 443m to set the drains of the NMOS transistors 443a, ..., 443m to the voltage level of the ground reference voltage source (0.0).

The high voltage pass transistors 451a, ..., 451m form the PMOS high voltage isolators 450a, ..., 450m. The gates of the high voltage pass transistors 451a, ..., 451m are connected together and to the isolation signal ISOB 366. When activated, the high voltage pass transistors 451a, ..., 451m connect the select gate lines 280a, ..., 280m to the row decode circuits 440a, ..., 440m through the select gate biasing lines 445a, ..., 445m. When deactivated, the high voltage pass transistors 451a, ..., 451m isolate the select gate lines 280a, ..., 280m to the row decode circuits 440a, ..., 440m.

The PMOS high voltage isolators 450a, ..., 450m are each formed in an independent N-type well 452a, ..., 452m. The N-type well 452a, ..., 452m for each of the N-type well 452a, ..., 452m is connected to an N-type well switch 455a, ..., 455m to individually charge or discharge the N-type wells 452a, ..., 452m. The N-type well switches 455a, ..., 455m include the PMOS transistors 456a, ..., 456m and 457a, ..., 457m and the NMOS transistors 458a, ..., 458m. The gates of the PMOS transistors 456a, ..., 456m and the NMOS transistors 458a, ..., 458m are connected to the out of phase block select signals XDB 432a, ..., 432m. The gates of the PMOS transistors 457a, ..., 457m are connected to the out of phase read signal RDB 364. The drains the PMOS transistors 456a, ..., 456m and 457a, ..., 457m and drains the NMOS transistors 458a, ..., 458m are connected to the N-type wells 452a, ..., 452m. The sources of the PMOS transistors 456a, ..., 456m and 457a, ..., 457m are connected to the positive N-well biasing voltage source VP1 362 and the sources of the NMOS transistors 458a, ..., 458m are connected to the negative N-well biasing voltage source VM1 360.

Figure 7:
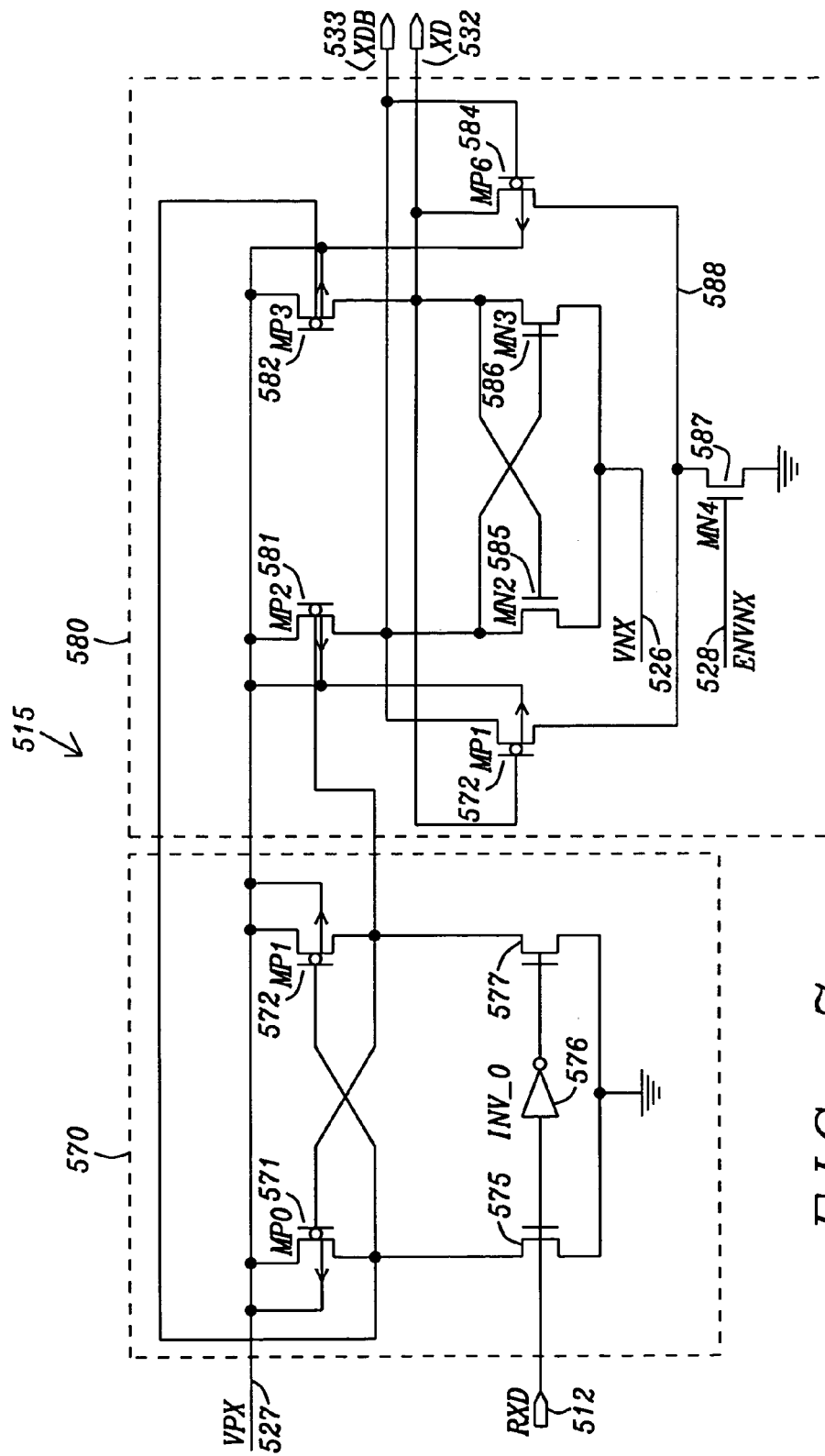
FIG. 7 is a schematic diagram of a level shifter circuit of the block row decoders of FIG. 6 embodying the principles of the present invention.

FIG. 7 is a schematic diagram of the level shifter circuits 315a, ..., 315m and 415a, ..., 415m respectively of the row decoder of FIG. 6a and the select gate decoder of FIG. 6b. Referring now to FIG. 7, the level shifter circuit 515 has two sub-level-shifter circuits 570 and 580 to translate the low voltage level of the block select signal RXD 512 to a voltage level of a positive high voltage power source VPX 527. The voltage translation maintains the drain to source breakdown voltage BVDSS that is less than ±10V such that special high voltage devices are not required for the circuitry of the nonvolatile memory device 200 of FIG. 4. The first level shift circuit 570 has pair of cross connected PMOS transistors 571 and 572 that have their sources and bulk regions connected to the positive high voltage power source VPX 527. The drain of the PMOS transistor 571 is connected to the gate of the PMOS transistor 572 and the drain of the PMOS transistor 572 is connected to the gate of the PMOS transistor 571. The drain of the PMOS transistors 571 is connected to the drain of the NMOS transistor 575 and the drain of the PMOS transistors 572 is connected to the drain of the NMOS transistor 577. The gate of the NMOS transistor 575 is connected to receive the block select signal RXD 512. The block select signal RXD 512 is connected to the input of the inverter 576. The output of the inverter 576 is connected to the gate of the NMOS transistor 577. The sources of the NMOS transistors 575 and 577 are connected to the ground reference voltage source (0.0).

The output nodes 573 and 574 of the first level shift circuit 570 are the input nodes of the second level shift circuit 580. The second level shift circuit 580 has a pair of PMOS transistors 581 and 582 that have their sources and bulk regions connected to the high voltage power supply VPX 527. The drain of the PMOS transistor 581 is connected to the drain of the NMOS transistor 585 and the source of the PMOS transistor 583. The drain of the PMOS transistor 582 is connected to the drain of the NMOS transistor 586 and the source of the PMOS transistor 584. The output node 573 of the first level shift circuit 570 is connected to the gate of the PMOS transistor 581 and the output node 574 of the first level shift circuit 570 is connected to the gate of the PMOS transistor 582. The sources of the NMOS transistors 585 and 586 are connected to the negative high voltage source VNX 526. The drains of the PMOS transistors 583 and 584 are connected to the drain of the NMOS transistor 587. The source of the NMOS transistor 587 is connected to the ground reference voltage source. The gate of the NMOS transistor 587 is connected to the negative power supply enable signal ENVNX 528. The out-of-phase block select signal XDB 533 is at the junction of the connection of the drains of the PMOS transistors 581 and 583 and the NMOS transistor 585. The in-phase block select signal XD 532 is at the junction of the connection of the drains of the PMOS transistor 582 and 584 and the NMOS transistor 586.

The first sub-level shifter circuit 570 receives the low voltage logic signal of the block select signal RXD 512 and generates the high voltage block select signal XD 532 and XDB 533. The two sub-level-shifter circuits 570 and 580, as designed, provide the positive and negative very high voltages and yet not exceed the drain-to-source breakdown voltage of the transistors of the two sub-level-shifter circuits 570 and 580. The negative power supply enable signal ENVNX 528 selectively activates the NMOS transistor 587 to provide the appropriate ground reference voltage level to allow the in-phase block select signal XD 532 and the out-of-phase block select signal XDB 533 to be set to the voltage level of the negative high voltage source VNX 526 during a program and erase.

Figure 8:
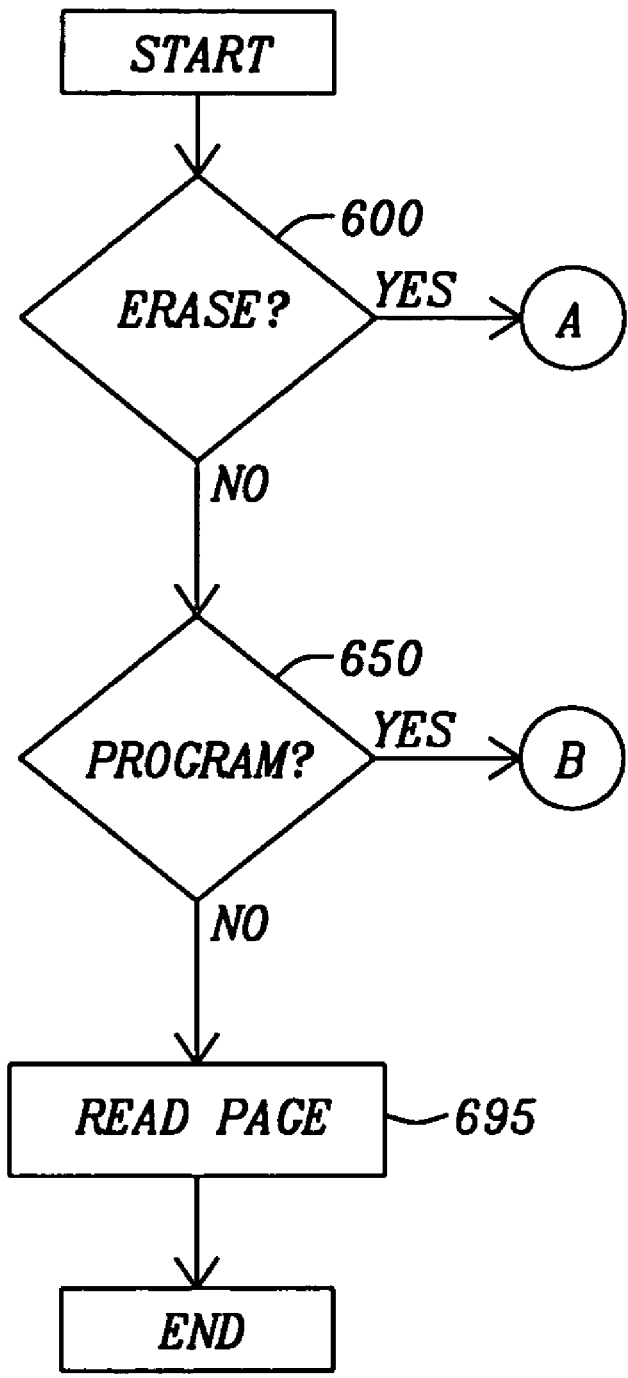
FIG. 8 is flow chart for the method for operating the nonvolatile memory device of FIG. 4.
Figure 9:
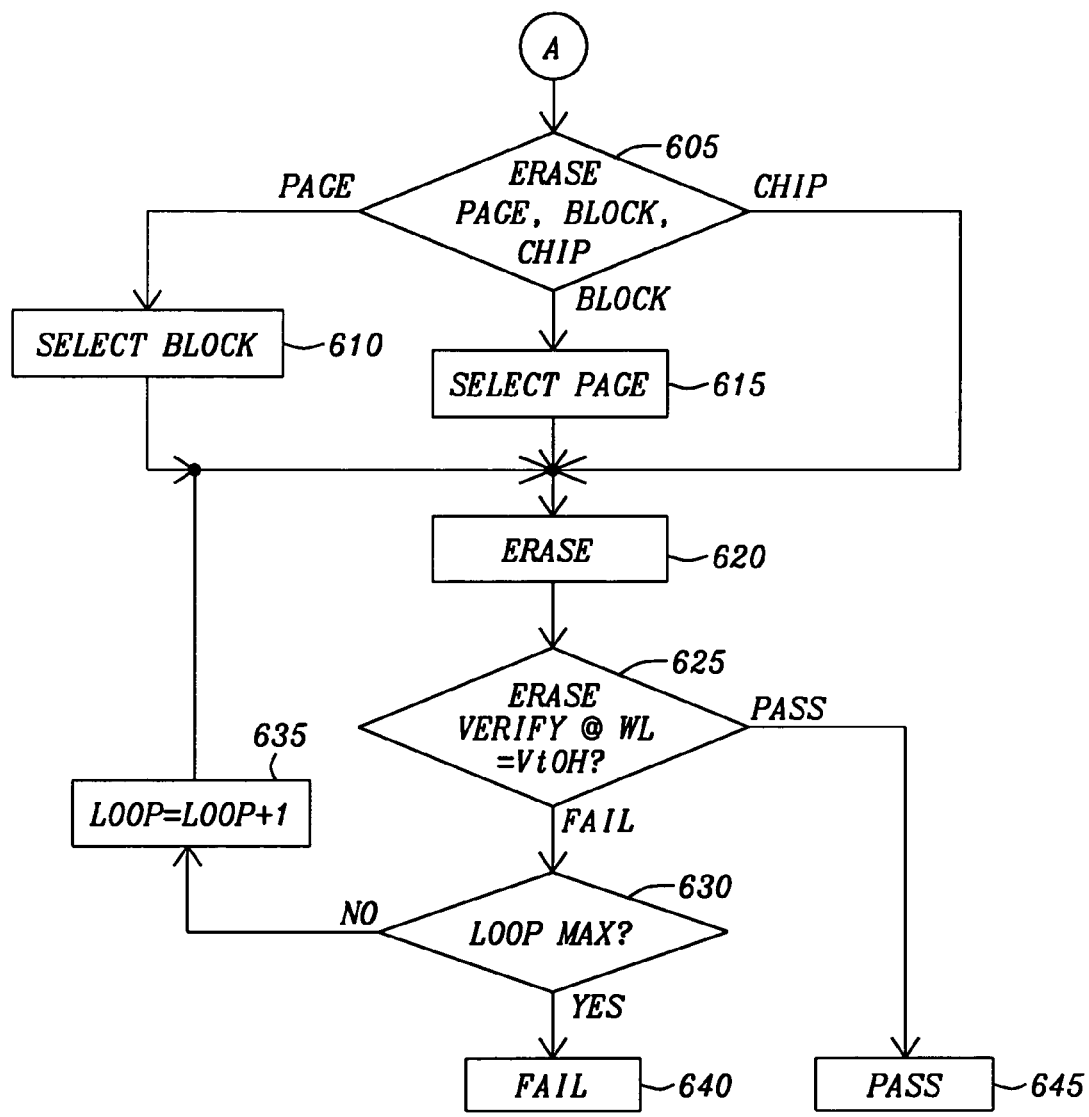
FIG. 9 is flow chart for the method for erasing and erase verifying a page, block, or chip of the nonvolatile memory device of FIG. 4.
Figure 10:
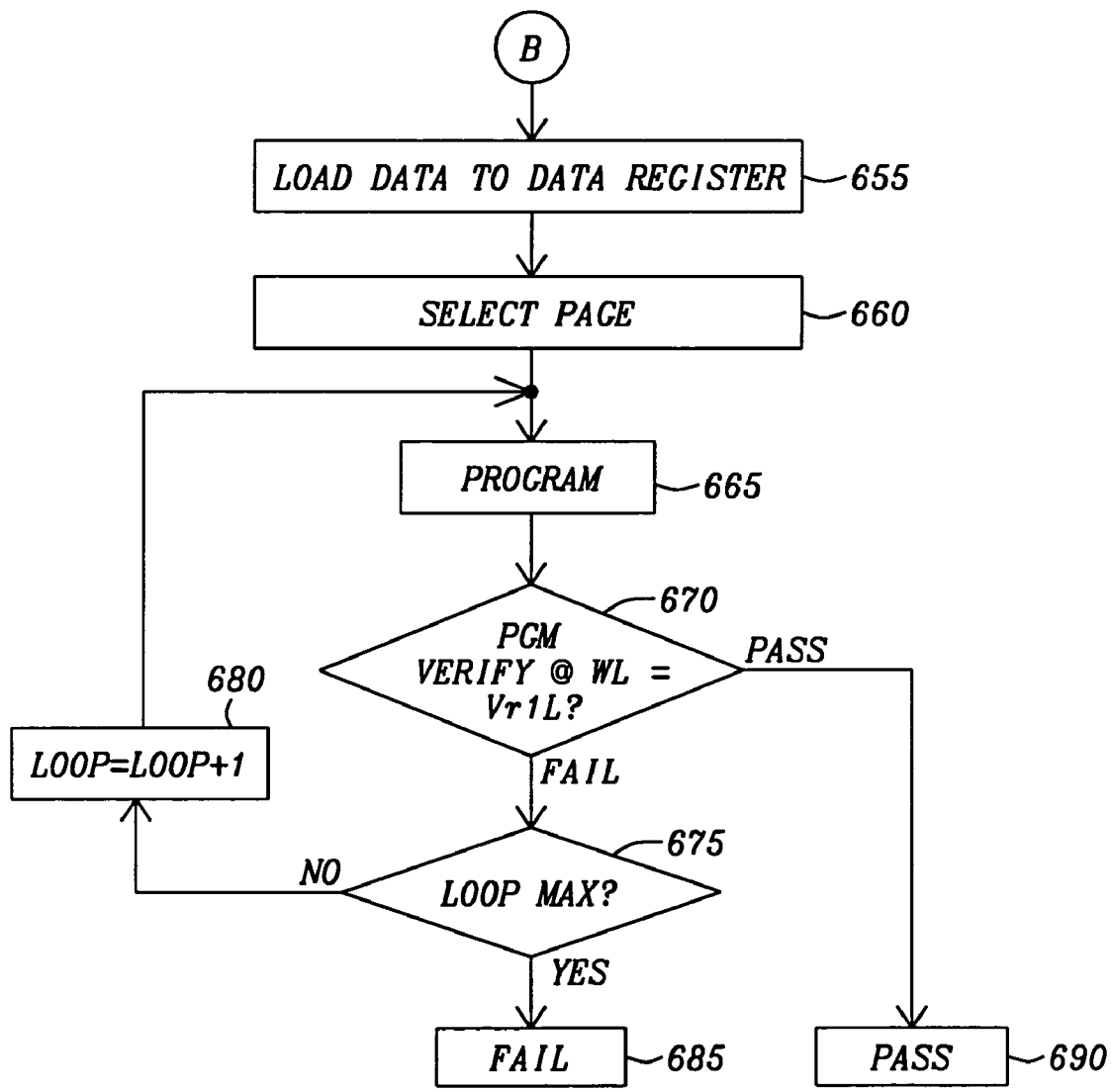
FIG. 10 is flow chart for the method for programming and program verifying a page of the nonvolatile memory device of FIG. 4.

FIG. 8 is flow chart for the method for operating the nonvolatile memory device 200 of FIG. 4. FIG. 9 is flow chart of the method for erasing and erase verifying a page, block, or chip of the nonvolatile memory device 200 of FIG. 4. FIG. 10 is flow chart of the method for programming and program verifying a page of the nonvolatile memory device 200 of FIG. 4. Refer now to FIGS. 4-11, 12a, and 12b for a discussion of the operating voltage levels required for the reading, programming, erasing, and verification of the nonvolatile memory device 200. The method begins by determining (Box 600) if the operation is an erase. If the operation is an erase operation, the erase is determined (Box 605) to be a page, block, or chip erase. If the operation is to be a page erase, the page to be erased is selected (Box 610) and the page is erased (Box 620). The voltage levels for erasing a page of the array 205 of EEPROM configured memory cells 5 are shown in FIG. 11 The word lines 275U of the unselected blocks 410U of the selected chips are set to the very high negative erase voltage is from approximately −8.0V to approximately −10.0V as coupled from the P-type well TPW 212. The P-type well TPW 212 of the selected chip set to the very high negative erase voltage is from approximately −8.0V to approximately −10.0V. The selected word line 275S of the selected block is set to a very high positive erase voltage is from approximately +8.0V to approximately +10.0V. The unselected word line 275SU in the selected block 410S is set to the approximately the voltage level of the ground reference voltage source (0.0V). The selected bit line 270S is set to the very high negative erase voltage is from approximately −8.0V to approximately −10.0V. The selected and unselected select gate line 280S are set to the very high negative erase voltage is from approximately −8.0V to approximately −10.0V.

To establish the page erase values as just described the row decoders 230*a*, 230*b*, . . . , 230*m* have voltage levels described in FIG. 12*a* and the select gate decoders 245*a*, 245*b*, . . . , 245*m* have voltage levels described in FIG. 12*b*. The selected word line 275S must be set to the very high positive erase voltage is from approximately +8.0V to approximately +10.0V and the unselected word lines 275SU of the selected block are set to the approximately the voltage level of the ground reference voltage source (0.0V). The unselected word lines 275U of the unselected blocks are coupled to the very high negative erase voltage is from approximately −8.0V to approximately −10.0V coupled from the P-type well TPW 212. The selected select gate line 280S, unselected select gate lines 280SU of the selected block, and unselected select gate lines 280U of the unselected blocks must be set to the very high negative erase voltage is from approximately −10.0V to approximately −8.0V. To accomplish these levels as shown in FIGS. 12*a* and 12*b*, the row decoders 275*a*, 275*b*, . . . , 275*n* of the selected blocks 410S have their selected high voltage power supply voltage line XT 335S associated with the selected word line 275S set to the very high positive erase voltage is from approximately +8.0V to approximately +10.0V to be fed through the row decode circuit 340*a*, . . . , 340*n* and the PMOS high voltage isolators 350*a*, . . . , 350*n* to the selected word line 275. The unselected high voltage power supply voltage line 335U associated with the selected word line 275SU set to the voltage level of the ground reference voltage level to be fed through the row decode circuit 340*a*, . . . , 340*n* and the PMOS high voltage isolators 350*a*, . . . , 350*n* to the unselected word line 275SU. The voltage level of the selected in-phase block select signals XD 330S, indicating that a block 210S is selected, is set to the very high positive erase voltage is from approximately +8.0V to approximately +10.0V and the voltage level of the out-of-phase block select signals XD 330U, indicating that the unselected blocks 410U are unselected, is set to approximately the voltage level of the ground reference voltage source (0.0V) to be coupled from the row decode circuit 340*a*, . . . , 340*n* through the PMOS high voltage isolators 350*a*, . . . , 350*m* such that the unselected word lines 275U are coupled to the very high negative erase voltage that is from approximately −8.0V to approximately −10.0V from the P-type well TPW 212. The N-type wells 352S of the selected block 410S is connected to the very high positive erase voltage is from approximately +8.0V to approximately +10.0V to avoid voltage breakdown in the PMOS high voltage isolators 350*a*, . . . , 350*m* and the N-type well switch 355*a*, . . . , 355*m*. The N-type wells 352U of the selected block 410U is connected to the voltage level of the ground reference voltage source (0.0V).

To transfer the very high positive erase voltage present on the selected high voltage power supply voltage line XT 335S to the selected word line 275S, the PMOS high voltage isolators 350*a*, . . . , 350*m* are activated with the isolation signal ISOB 366 is set to the voltage level of the ground reference voltage source (0.0V). The out of phase read signal RDB 364, positive high voltage power source VPX 327, and the positive N-well biasing voltage source VP1 362 are set to the very high positive erase voltage is from approximately +8.0V to approximately +10.0V to set the selected word line 275S to the voltage level of the very high positive erase voltage is from approximately +8.0V to approximately +10.0V. The high negative voltage source VNX 326, negative power supply enable signal ENVNX 328 are set to the voltage level of the ground reference voltage source (0.0V) to set the unselected word lines 275SU of the selected block 410S to approximately the voltage level of the ground reference voltage source (0.0V).

The select gate decoders 280*a*, 280*b*, . . . , 280*m* of the selected blocks 410S have their selected high voltage power supply voltage line XT 435S associated with the selected select gate line 280S, the unselected high voltage power supply voltage line XT 435U associated with the unselected select gate lines 280SU of the selected block, and unselected select gate lines 280U of the unselected blocks are set to the voltage level of the very high negative erase voltage to be fed through the row decode circuit 440*a*, . . . , 440*m* and the PMOS high voltage isolators 450*a*, . . . , 450*m* to the selected select gate line 280S and unselected select gate lines 280SU and 280U. The voltage level of the selected in-phase block select signals XD 430S and the voltage level of the out-of-phase block select signals XD 430U are set to the very high negative erase voltage to be coupled from the row decode circuit 440*a*, . . . , 440*m* through the PMOS high voltage isolators 450*a*, . . . , 450*m* such that the selected select gate line 280S and the unselected select gate lines 280SU and 280U are set to the very high negative erase voltage that is from approximately −8.0V to approximately −10.0V. The N-type wells 452S of the selected block 410S and the N-type wells 452U of the selected blocks 410U are connected to the voltage level of the ground reference voltage source (0.0V).

To transfer the very high negative erase voltage present on the selected high voltage power supply voltage lines XT 435S, 435SU, and 435U to the selected select gate line 280S, the PMOS high voltage isolators 450*a*, . . . , 450*m* are activated with the isolation signal ISOB 466 is set to a very high negative select level of approximately −12V. The out of phase read signal RDB 464 is set to the very high positive erase voltage. The positive high voltage power source VPX 427 is set to the voltage level of the ground reference voltage source (0.0V) and the high negative voltage source VNX 426 is set to the very high negative erase voltage level. The negative power supply enable signal ENVNX 428 is set to the voltage level of the power supply voltage source VDD and set the selected gate lines 280S and the unselected select gate lines 280SU and 280U of the selected and unselected blocks to very high negative erase voltage.

Returning now to FIG. 9, after the completion of the page erase operation (Box 620), the page erase verify operation is executed (Box 625) to determine if the erase has been successfully accomplished. The voltage levels for the page erase verification for the array 205 of the EEPROM configured memory cells 5 are shown in FIG. 11. Referring to FIG. 11, the selected word line 275S and the unselected word lines 275SU of the selected blocks 410 S and the unselected word lines 275U of the unselected blocks 410U are set to the lower boundary of the threshold voltage Vt1L that is approximately +4.0V. The selected bit line 270S is pre-charged to the second read biasing voltage that is approximately the voltage level of the power supply voltage source VDD less a threshold voltage Vt of an NMOS transistor. The pre-charged level of the second read biasing voltage is discharged to approximately 0.0V when the memory cell has not been successfully erased and has a threshold voltage level is less than the lower boundary of the erased threshold voltage level Vt1L. If the EEPROM configured nonvolatile memory cells are erased, the pre-charged level of the second read biasing voltage will be maintained when the threshold voltage of the erased EEPROM configured nonvolatile memory cells is greater than the lower boundary of the erased threshold voltage level Vt1L. The selected select gate line 280S is set to the high read select voltage HV" that is approximately +5.0V and the unselected select gate lines are set a voltage level of the voltage level of the ground reference voltage source (0.0V).

Referring to FIG. 12a to discuss the voltage levels of the row decoders 230a, 230b, ..., 230m, the selected word line 275S and the unselected word lines 275SU and 275U are set to the lower boundary of the erase threshold voltage level Vt1L by setting selected high voltage power supply voltage line XT 335S and the unselected high voltage power supply voltage line XT 335SU and 335U to the voltage level of the lower boundary of the erase threshold voltage level Vt1L. The voltage level of the selected and unselected in-phase block select signals XD 330S and 330U, the positive high voltage power source VPX 327, and the selected and unselected negative N-well biasing voltage lines NW 352a and NW 352U are set to lower boundary of the erase threshold voltage Vt1L to pass the lower boundary of the erase threshold voltage level Vt1L to the selected word line 275S. The out of phase read signal RDB 364, the first high negative voltage source VNX 326, and the negative power supply enable signal ENVNX 328 are set to the voltage level of the ground reference voltage source (0.0V). The isolation signal ISOB 366 is set to a first negative read activation voltage level of approximately −5.0V. These voltage levels, as described, fully pass the lower boundary of the erase threshold voltage level Vt1L from the selected and unselected high voltage power supply voltage line XT 335S and XT 335U to the selected word line 275S and the unselected word lines 275SU and 275U.

Returning to FIG. 11, the selected bit lines BL 270S for the selected columns are pre-charged to the pre-charge voltage level of the power supply voltage source VDD less the threshold voltage Vt (VDD−Vt) for sensing the status of the selected floating-gate memory transistor MC of the EEPROM configured memory cells 5 on the activated columns. The pre-charge voltage level (VDD−Vt) will be discharged to 0V when any of the floating-gate memory transistors MC have not been successfully erased to the lower boundary of the threshold voltage level Vt1L of the floating-gate memory transistor MC is lower than the lower boundary of the erased threshold voltage level. If the floating-gate memory transistors MC are erased, the pre-charged level will be maintained when the threshold voltage of the floating-gate memory transistor MC is greater than the erased threshold voltage level Vt1L. The select gate lines 280S for the selected block is set to the voltage level of the high read select voltage HV" of approximately +5.0V to fully couple the pre-charged voltage level of second read biasing voltage that is the power supply voltage source VDD less the threshold voltage Vt (VDD−Vt) from the bit lines 270a, ..., 270k to the drains of the selected floating-gate memory transistors MC.

Referring to FIG. 12b to discuss the voltage levels of the select gate decoders 245a, 245b, ..., 245m, the selected select gate line 280S is set to the high read select voltage HV" by setting selected high voltage power supply voltage line XT 435S to the high read select voltage HV". The unselected select gate lines 280SU and 280U are set to the voltage level of the ground reference voltage source (0.0V) by setting the unselected high voltage power supply voltage line XT 435SU and 435U to the voltage level of the ground reference voltage source (0.0V). The voltage level of the selected in-phase block select signals XD 430S, selected and unselected negative N-well biasing voltage lines NW 452S and NW 452U, and the positive high voltage power source VPX 427 are set to the high read select voltage HV". The unselected in-phase block select signals 430U, negative high voltage power source VNX 426, the out of phase read signal RDB 464, and the negative power supply enable signal ENVNX 428 are set to the voltage level of the ground reference voltage source (0.0V). The isolation signal ISOB 466 is set to a second negative read activation voltage level of approximately −5.0V. These voltage levels, as described, fully pass the high read select voltage HV" from the selected high voltage power supply voltage line XT 435S to the selected select gate line 280S. Further, the voltage levels, as described, fully pass voltage level of the ground reference voltage source (0.0V) from the unselected high voltage power supply voltage line XT 435U to the unselected select gate lines 280U.

Returning to FIG. 9, if the page erase verify (Box 625) indicates the page erase (Box 620) is not successful, a loop counter is tested (Box 630) to assess that the maximum number of erasure trials is not exceeded. If the maximum number of erasure trials is not exceeded, the loop counter is incremented (Box 635) and the page erase operation (Box 620) is executed repetitively until the maximum number of erasure trials is exceeded and the nonvolatile memory device is declared as having failed (Box 640) or the erasure is a success and the nonvolatile memory device is declared as having successfully been erased (Box 645).

Return now to FIG. 9. If the operation is not a page erase but is determined (Box 605) to be a block erase, the block to be erased is selected (Box 615) and the block is erased (Box 615). Referring now to FIGS. 11, 12a and 12b, the voltage levels for the block erase are identical to that of the page erase described above except that there are no unselected word lines 275SU in the selected block 410S. All the word lines 275S are now selected for erasure and placed at the very high positive erase voltage level of from approximately +8.0V to approximately +10.0V to accomplish the block erase.

Returning now to FIG. 9, after the completion of the block erase operation (Box 620), the block erase verify operation is executed (Box 625) to determine if the block erase has been successfully accomplished. The block erase verify operation (Box 625) is identical to the page erase verify. The selected and unselected word lines 275S, 275SU, and 275U are set to a voltage level of the lower boundary of the erase threshold voltage Vt1L or approximately +4.0V for the single level cell program as shown in FIG. 12a.

Returning to FIG. 9, if the block erase verify (Box 625) indicates that the block erase (Box 620) was not successful, a loop counter is tested (Box 630) to assess that the maximum number of erasure trials is not exceeded. If the maximum number of erasure trials is not exceeded, the loop counter is incremented (Box 635) and the block erase operation (Box 620) is executed repetitively until the maximum number of erasure trials is exceeded and the nonvolatile memory device is declared as having failed (Box 640) or the erasure is a success and the nonvolatile memory device is declared as having successfully been erased (Box 645).

If the operation is to be a chip erase, the chip is erased (Box 625). Referring now to FIGS. 11, 12*a* and 12*b*, the voltage levels for the chip erase are identical to that of the page erase and block erase described above except that there are no unselected word lines 275SU or 275U. All the word lines 275S are now selected for erasure and placed at the very high positive erase voltage level of from approximately +8.0V to approximately +10.0V to accomplish the chip erase.

Returning now to FIG. 9, after the completion of the chip erase operation (Box 625), the chip erase verify operation is executed (Box 630) to determine if the block erase has been successfully accomplished. The chip erase verify (Box 625) is identical to the page erase verify. All the selected and unselected word lines 275S, 275SU, and 275U are set to a voltage level of the lower boundary of the erase threshold voltage Vt1L.

If the chip erase verify (Box 625) indicates that the block erase (Box 620) was not successful, a loop counter is tested (Box 630) to assess that the maximum number of erasure trials is not exceeded. If the maximum number of erasure trials is not exceeded, the loop counter is incremented (Box 635) and the chip erase (Box 620) operation is executed repetitively until the maximum number of erasure trials is exceeded and the nonvolatile memory device is declared as having failed (Box 640) or the erasure is a success and the nonvolatile memory device is declared as having successfully been erased (Box 645).

Returning now to FIG. 8, if the operation is determined (Box 600) not to be an erase operation, the operation is determined (Box 650) if it is a program operation. If the operation is determined (Box 650) to be a page program operation (referring to FIG. 10), data is loaded (Box 655) to the data register and sense amplifier 260 and the page to be programmed is selected (Box 660) to be transferred to the bit line 270*a*, . . . , 270*k* through the activation of the data register and sense amplifier 260. The floating-gate memory transistors MC of the selected page are then programmed with the voltage levels applied as shown in FIG. 11, 12*a*, and 12*b*. Referring to FIG. 11, the unselected word lines 275U of the unselected blocks 410U because the unselected row decode circuits 340*a*, . . . , 340*m* are turned off and the unselected word lines 275SU of the selected block 410S are set to the voltage level of the ground level voltage source (0.0V). The selected word line 275S is set to the high negative program voltage level that is from approximately −8.0V to approximately −10, which is somewhat less than the drain to source breakdown voltage BVDSS of the transistors of the row decoder 220 of FIG. 4. The selected bit lines BL 270S for the columns that are to be programmed are set to the high program voltage is approximately +5.0V. The unselected bit lines BL 270U (the program inhibited) for the columns that are to remain erased are set to a voltage level of approximately the ground reference voltage source (0.0V) or alternately disconnected and allowed to float. The selected select gate line 280S connected to the selected page is set to the high program select voltage of approximately 10.0V. The unselected select gate lines 280U are set to the voltage level of the ground reference voltage source (0.0V). The source lines of the array 205 of EEPROM configured memory cells 5, and the P-type well TPW 212 in which the array 205 of EEPROM configured memory cells 5 are formed is set to the voltage level of the ground reference voltage source (0.0V).

To establish the voltage levels as described for the programming in FIG. 11, the row decoder 220 has the voltage levels shown in FIGS. 12*a* and the select gate decoder has the voltage levels shown in FIG. 12*b*. Referring to FIG. 12*a*, to have the selected word line 275S set to a high negative program voltage level that is from approximately −8.0V to approximately −10.0V, the selected high voltage power supply voltage line XT 335S associated with the selected word line 275S set to the very high negative program voltage level. To have the unselected word lines 275SU set to the voltage level of the ground reference voltage source (0.0V), the unselected high voltage power supply voltage line XT 335SU associated with the unselected word lines 275SU set to the voltage level of the ground reference voltage source (0.0V). To have the unselected word lines 275U of the unselected blocks disconnected and floating the selected row decode circuit 340*a*, . . . , 340*m* are deactivated to disconnect the unselected word lines 275U to be floating. The voltage level of the selected in-phase block select signals XD 330S, indicating that a block 410S is selected is set to approximately the voltage level of the ground reference voltage source (0.0V) such that the very high negative program voltage is coupled from the selected row decode circuit 340*a*, . . . , 340*n* through the PMOS high voltage isolator 350*a*, . . . , 350*m* to the selected word line 275S. The voltage level of the out-of-phase block select signals XD 330U, indicating that a block is unselected, is set to the very high negative program voltage to turn off all the voltages from the unselected high voltage power supply voltage line XT 335U and XT335SU to the force unselected word line 275SU and 275U to be disconnected and allowed to float. The selected N-type well NW 352S of the selected block and the N-type wells 352U of the unselected blocks 410U are connected to the voltage level of approximately the ground reference voltage source (0.0V). The isolation signal ISOB 366 is set to a very large program activation voltage level of approximately −12.0V to activate the PMOS high voltage isolators 350*a*, . . . , 350*m* to transfer the very high negative program voltage to the selected word lines 275S and the voltage level of the ground reference voltage source (0.0V) to the unselected word lines 275 SU and disconnecting the unselected word lines 275U such that they are floating. The out of phase read signal RDB 364 is set to the very high negative program voltage. The positive high voltage power source VPX 327 is set to the voltage level of the ground reference voltage source (0.0V) and the negative high voltage power source VNX 326 is set to the very high negative program voltage. To enable the passage of the very high negative program voltage from the negative high voltage power source VNX 326, the negative power supply enable signal ENVNX 328 is set to the voltage level of the power supply voltage source VDD.

Referring now to FIG. 12*b*, the selected select gate line 280S is set to the very high positive program voltage that is from approximately +8.0V to approximately +10.0V. The unselected select gate lines 280SU and 280U are voltage level of the ground reference voltage source (0.0V). Further, the selected select gate lines 280S is to be set to the voltage level of very high program voltage level of from approximately +8.0V to approximately +10.0V and the unselected select gate lines 280S is to be set to the voltage level of approximately the ground reference voltage source (0.0V). To have the selected select gate line 280S set to the very high program voltage level, the selected high voltage power supply voltage line XT 435S associated with the selected select gate lines 280S set to very high program voltage level. To have the unselected select gate lines 280SU and 280U set to the voltage level of the ground reference voltage source (0.0V), the unselected high voltage power supply voltage line XT 435U associated with the unselected select gate lines 280U set to the voltage level of the ground reference voltage source (0.0V). The voltage level of the selected in-phase block select signal XD 430S, indicating that a block is selected is set to approximately the high program select voltage of approximately +10.0V. The voltage level of the unselected in-phase block select signals XD 430S, indicating that a block is selected, are set to the voltage level of the ground reference voltage source (0.0V). The selected N-type well NS 452S of the selected block and the N-type wells 452U of the unselected blocks is set to the high program select voltage of approximately +10.0V. The isolation signal ISOB 466 is set to the voltage level of a negative pass gate activation voltage level of approximately −2.0V to activate the PMOS high voltage isolators 450*a*, . . . , 450*m* to transfer the very high positive program voltage to the selected select gate lines 280S and the voltage level of the ground reference voltage source (0.0V) to the unselected select gate lines 280 SU and 280U. The out of phase read signal RDB 464 is set to the voltage level of the ground reference voltage source and the positive high voltage power source VPX 427 is set to the very high positive program voltage that is from approximately +8.0V to approximately +10.0V. The negative high voltage power source VNX 426 is set to the very high negative program voltage. To enable the passage of the very high negative program voltage from the negative high voltage power source VNX 426, the negative power supply enable signal ENVNX 428 is set to the voltage level of the ground reference voltage source.

Returning now to FIG. 10, after the completion of the program operation (Box 665), the page program verify operation is executed (Box 670) to determine if the program has been successfully accomplished. If the program operation (Box 665) is not successful, a loop counter is tested (Box 675) to assess that the maximum number of program trials is not exceeded. If the maximum number of program trials is not exceeded, the loop counter is incremented (Box 680) and the page program operation (Box 665) is executed repetitively until the maximum number of program trials is exceeded and the nonvolatile memory device is declared as having failed (Box 685) or the programming is a success and the nonvolatile memory device is declared as having successfully been erased (Box 690).

Referring to FIG. 11, the program verify operation (Box 670) is essentially the same as the erase verify (Box 630) of FIG. 9 except the selected word line 275S is set to the upper boundary of the threshold voltage level Vt0H to evaluate the programmed threshold voltage of the selected NMOS floating gate transistors Mc.

Figure 13:
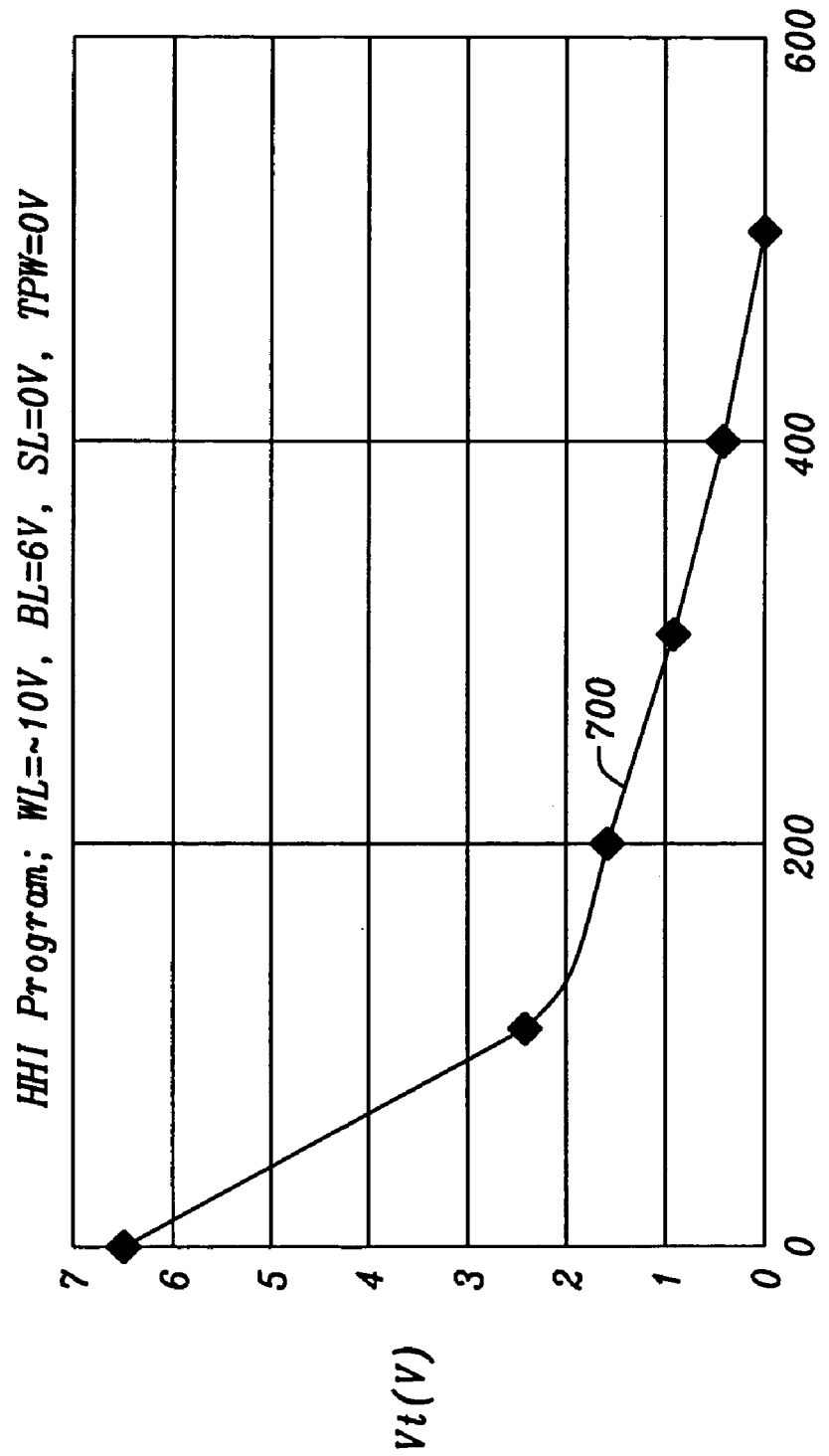
FIG. 13 is a plot of threshold voltage for the floating gate memory transistor in the two floating-gate transistor EEPROM configured memory cell embodying the principles of the present invention vs. program time for hot-hole injection.

FIG. 13 is a plot of threshold voltage for the floating gate memory transistor in the two floating-gate transistor EEPROM configured memory cell embodying the principles of the present invention vs. program time for hot hole injection. In the example illustrated the selected bit lines BL 270S for the columns that are to be programmed are increased from the high program voltage that is approximately +5.0V to a voltage of approximately +6.0V to activate a Fowler-Nordheim hot-hole injection phenomena. It can be seen that the threshold voltage Vt of the floating-gate memory transistor MC of the EEPROM configured memory cells 5 are able to be programmed to a lower voltage level 700 of approximately +1.0V in approximately 300 μs. The setting of the selected bit lines BL 270S for the columns that are to be programmed to the higher program voltage is approximately +6.0V allows the Fowler-Nordheim hot-hole injection phenomena or maintaining the high program voltage of approximately +5.0V allows a slower Fowler-Nordheim drain edge injection. The program current for each cell in these examples is approximately 1.0 nA. This permits a page program that is similar to that of a NAND flash nonvolatile memory page program operation.

Returning now to FIG. 8, if the operation is determined (Box 650) not to be a program operation, the operation is a read operation and the read operation is executed (Box 695). The selected page is then read with the voltage levels applied as shown in FIG. 11, 12*a*, and 12*b*. Referring to FIG. 11, the selected word line 275S and the unselected word lines 275SU of the selected blocks and the unselected word lines 275U of the unselected blocks are set to the read voltage threshold VR that is approximately the level of the power supply voltage source VDD. The selected bit line 270S is set to the first read voltage level of approximately +1.0V. The selected select gate line 280S is set to the high read select voltage HV′′′ that is approximately +5.0V and the unselected select gate lines 280S and 280SU are set a voltage level of the voltage level of the ground reference voltage source (0.0V).

Referring to FIG. 12*a* to discuss the voltage levels of the row decoders 230*a*, 230*b*, . . . , 230*n*, . . . , 245*n*, the selected word line 275S and the unselected word lines 275SU and 275U are set to the read voltage threshold VR by setting selected high voltage power supply voltage line XT 335S and the unselected high voltage power supply voltage line XT 335SU and 335U to the voltage level of the read voltage threshold VR. The voltage level of the selected and unselected in-phase block select signals XD 330S and 330U, the positive high voltage power source VPX 327, and the selected and unselected negative N-well biasing voltage lines NW 352S and NW 352U are set to the voltage level of the power supply voltage source VDD to pass the read voltage threshold VR to the selected word line 275S. The out of phase read signal RDB 364, the first high negative voltage source VNX 326, and the negative power supply enable signal ENVNX 328 are set to the voltage level of the ground reference voltage source (0.0V). The isolation signal ISOB 366 is set to a first negative read activation voltage level of approximately −5.0V. These voltage levels, as described, fully pass the read voltage threshold VR from the selected and unselected high voltage power supply voltage line XT 335S and XT 335U to the selected word line 275S and the unselected word lines 275SU and 275U.

Returning to FIG. 11, the selected bit lines BL 270S for the selected columns are pre-charged to the first read voltage level of approximately +1.0V for sensing the status of the selected floating-gate memory transistor MC of the EEPROM configured memory cells 5 on the activated columns. The selected select gate lines 280S for the selected block is set to the voltage level of the high read select voltage HV′′′ of approximately +5.0V to fully couple the read voltage threshold VR from the bit lines 270*a*, . . . , 270*k* to the selected floating-gate memory transistors MC.

Referring to FIG. 12*b* to discuss the voltage levels of the select gate decoders 245*a*, 245*b*, . . . , 245*m*, the selected select gate line 280S is set to the high read select voltage HV′′′ by setting selected high voltage power supply voltage line XT 435S to the high read select voltage HV′′′. The unselected select gate lines 280SU and 280U are set to the voltage level of the ground reference voltage source (0.0V) by setting the unselected high voltage power supply voltage line XT 435SU and 435U to the voltage level of the ground reference voltage source (0.0V). The voltage level of the selected in-phase block select signals XD 430S, selected and unselected negative N-well biasing voltage lines NW 452n and NW 452U, and the positive high voltage power source VPX 427 are set to the high read select voltage HV′′′. The unselected in-phase block select signals 430U, negative high voltage power source VNX 426, the out of phase read signal RDB 464, and the negative power supply enable signal ENVNX 428 are set to the voltage level of the ground reference voltage source (0.0V). The isolation signal ISOB 466 is set to a second negative read activation voltage level of approximately −5.0V. These voltage levels, as described, fully pass the lower boundary of the high read select voltage HV″ from the selected high voltage power supply voltage line XT 435S to the selected select gate line 280S. Further, the voltage levels, as described, fully pass voltage level of the ground reference voltage source (0.0V) from the unselected high voltage power supply voltage line XT 435U to the unselected select gate lines 280U and 280SU.

Figure 14:
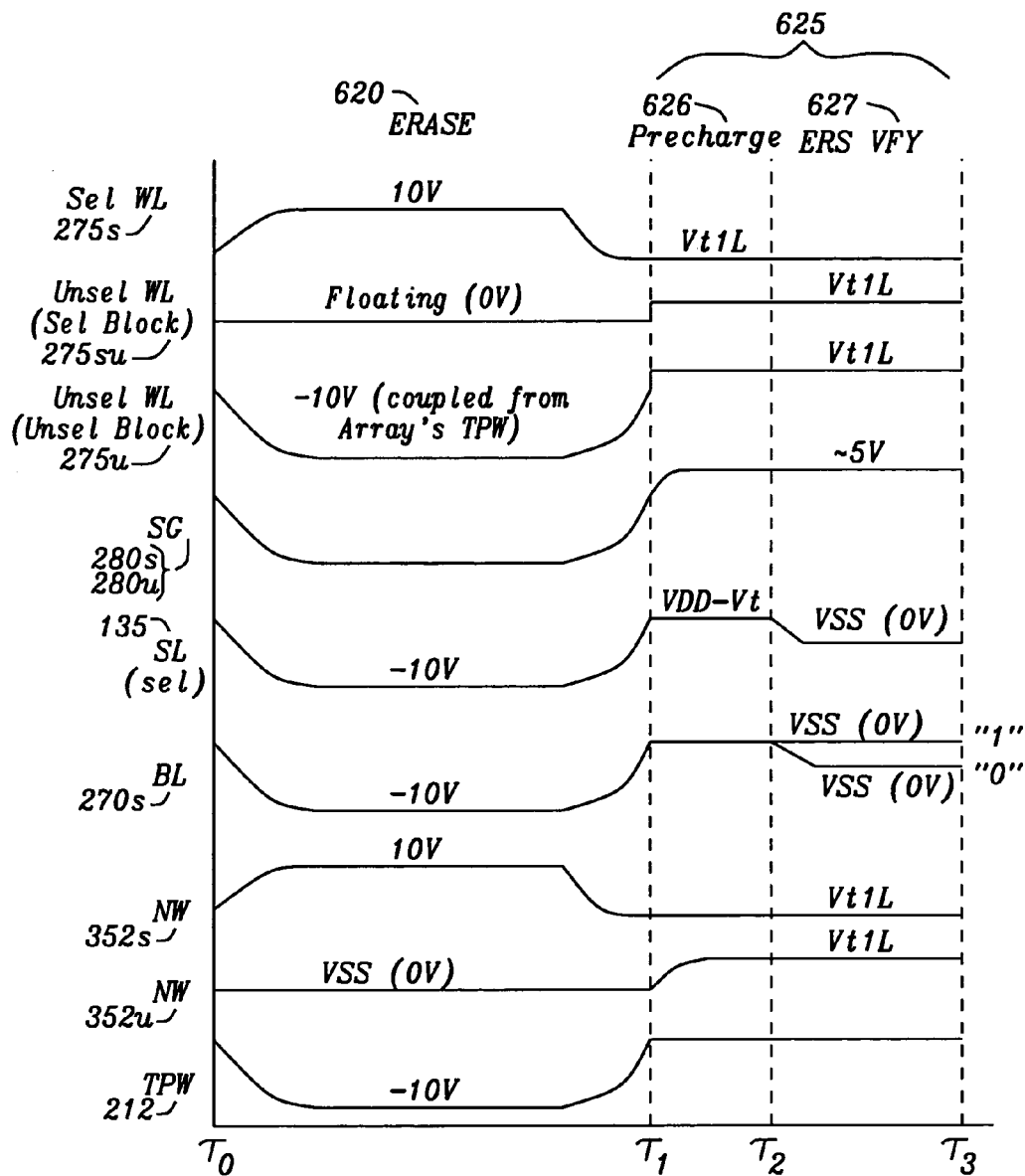
FIG. 14 is a timing diagram for erasing and erase verification of a block of the nonvolatile memory device of FIG. 5.
Figure 15:
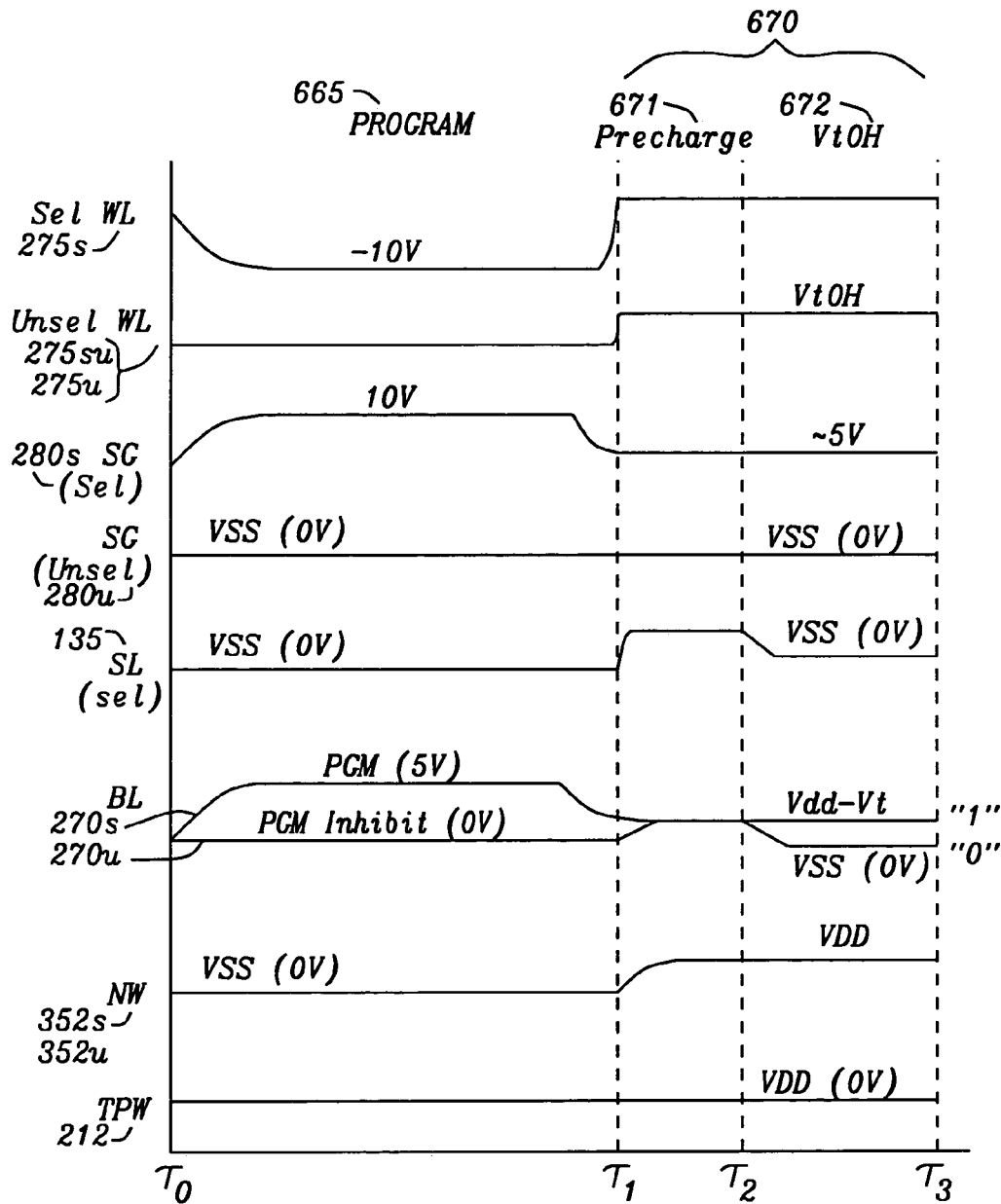
FIG. 15 is a timing diagram for programming and program verification of a block of the nonvolatile memory device of FIG. 5.

Refer to FIGS. 14 and 15 for a summary of the erase and program operations of the floating-gate memory transistor MC of the EEPROM configured memory cells 5 of FIG. 5 within the EEPROM memory array 205 of FIG. 4. FIG. 14 is a timing diagram for erasing and erase verification of a block of the nonvolatile memory device of FIG. 5. During the erase operation 620 between the time $\tau_0$ and the time $\tau_1$. The voltage levels are as described above for FIGS. 11, 12a, and 12b to initiate an Fowler-Nordheim channel tunneling phenomena to inject more electrons to the floating-gate to increase the threshold voltage Vt of the floating-gate memory transistor MC of the EEPROM configured memory cells 5 to greater than the lower boundary of the threshold voltage Vt1L that is approximately +4.0V.

The erase verify operation 625 has two segments a pre-charge period 626 and the verification period 627. The pre-charge period 626 is between the time $\tau_1$ and the time $\tau_2$. At this time, the selected bit line 270S is pre-charged to the second read biasing voltage that is approximately the voltage level of the power supply voltage source VDD less a threshold voltage Vt of an NMOS transistor. In the verification time between the time $\tau_2$ and the time $\tau_3$, the pre-charged level of the second read biasing voltage is discharged to approximately 0.0V when the memory cells have not been successfully erased and has a threshold voltage level that is less than the lower boundary of the erased threshold voltage level Vt1L. If the EEPROM configured nonvolatile memory cells 5 are erased, the second read biasing voltage will be maintained when the threshold voltage of the erased EEPROM configured nonvolatile memory cells 5 is greater than the lower boundary of the erased threshold voltage level Vt1L. The Y-pass gate and sense amplifier 260b of FIG. 4 determines if the floating-gate memory transistor MC of the EEPROM configured memory cells 5 are erased and has achieved the threshold voltage level representing the datum of a logical "1". If the floating-gate memory transistor MC of the EEPROM configured memory cells 5 is not erased, the data register and sense amplifier 260 of FIG. 4 determines that the floating-gate memory transistor MC of the EEPROM configured memory cells 5 has not achieved the threshold voltage level representing a datum of logical "1". The voltage levels as shown are established as described above for FIGS. 11, 12a, and 12b.

FIG. 15 is a timing diagram for programming and program verification of a block of the nonvolatile memory device of FIG. 5. During the program operation 665 between the time $\tau_0$ and the time $\tau_1$. The voltage levels are as described above for FIGS. 11, 12a, and 12b to initiate an Fowler-Nordheim drain edge tunneling phenomena to extract electrons to the floating-gate to decrease the threshold voltage Vt of the floating-gate memory transistor MC of the selected EEPROM configured memory cells 5 on the selected bit lines 270S to less than the upper boundary of the threshold voltage Vt0H that is approximately +1.0V. For the floating-gate memory transistor MC of the unselected EEPROM configured memory cells 5 on the unselected bit lines 270U, the program inhibit voltage level that is the ground reference voltage source is applied to the unselected bit lines 270U.

The program verify operation 670 has two segments a pre-charge period 671 and the verification period 672. The pre-charge period 671 is between the time $\tau_1$ and the time $\tau_2$. At this time, the selected bit lines 270S are pre-charged to approximately the voltage level of the power supply voltage source VDD less a threshold voltage Vt of an NMOS transistor. In the verification time between the time $\tau_2$ and the time $\tau_3$, the pre-charged level of the second read biasing voltage is discharged to approximately 0.0V when the memory cell has not been successfully programmed and has a threshold voltage level that is less than the upper boundary of the programmed threshold voltage level. If the EEPROM configured nonvolatile memory cells 5 are not programmed, the pre-charged level will be maintained when the threshold voltage of the programmed EEPROM configured nonvolatile memory cells 5 is greater than the upper boundary of the programmed threshold voltage level. The data register and sense amplifier 260 of FIG. 4 determines if the floating-gate memory transistor MC of the EEPROM configured memory cells 5 are programmed and has achieved the threshold voltage level representing the datum of a logical "0". If the floating-gate memory transistor MC of the EEPROM configured memory cells 5 is not programmed, the data register and sense amplifier 260 of FIG. 4 determines that the floating-gate memory transistor MC of the EEPROM configured memory cells 5 has not achieved the threshold voltage level representing a datum of logical "0". The voltage levels as shown are established as described above for FIGS. 11, 12a, and 12b.

The description of the nonvolatile memory device 200 of FIG. 4 incorporating EEPROM configured memory cells having a floating-gate memory transistor and a floating gate select transistor. In other embodiments, the EEPROM configured memory cells include charge trapping transistor formed with a layers of silicon, a first layer of silicon dioxide, silicon nitride, a second layer of silicon oxide and a layer of polycrystalline silicon commonly referred to as a SONOS charge trapping transistor to form a charge trapping memory transistor and a charge trapping select transistor within the EEPROM configured memory cells to embody the principles of this invention. Further, as shown in FIG. 14, other voltage levels may be used for reading, programming, erasing and verifying the EEPROM configured memory cells in other embodiments and still be in keeping with the principles of this invention. One key aspect of the principles of this invention is that the structure of the row decoder 220, the select gate decoder 240, and the data register and Sense Amplifier 260 of FIG. 4 provide the operating voltages voltage levels that do not exceed the drain-to-source breakdown voltage of the transistors used to construct the row decoder 220, the select gate decoder 240, and the data register and Sense Amplifier 260 of FIG. 4.

While this invention has been particularly shown and described with reference to the preferred embodiments thereof, it will be understood by those skilled in the art that various changes in form and details may be made without departing from the spirit and scope of the invention.

The invention claimed is:
1. A method for operating an array of EEPROM connected flash nonvolatile memory cells at increments of a page and block comprising:
 programming selected EEPROM connected flash nonvolatile memory cells by the steps of:

generating a very large positive programming voltage, a high program voltage, and a very large negative programming voltage so as to prevent drain to source breakdown in peripheral row decoding and generating circuits, and applying the very large positive programming voltage to a gate of a charge retaining select transistor, the high program voltage to a drain of a charge retaining memory transistor of the selected EEPROM connected flash nonvolatile memory cells and the very large negative programming voltage to a control gate of a charge retaining memory transistor of the selected EEPROM connected flash nonvolatile memory cells to initiate a Fowler-Nordheim tunneling phenomena while minimizing operational disturbances in with in unselected EEPROM connected flash nonvolatile memory cells; and erasing selected EEPROM connected flash nonvolatile memory cells by the steps of:

generating a very large positive erasing voltage and a very large negative erasing voltage to prevent drain to source breakdown in the peripheral row decoding and generating circuits, and applying the very large positive erasing voltage to the control gate of the charge retaining memory transistor of the selected EEPROM connected flash nonvolatile memory cells and the very large negative erasing voltage to a drain and source of the charge retaining memory transistor and the gate of the charge retaining select transistor of the selected EEPROM connected flash nonvolatile memory cells and to an isolation diffusion well into which the selected EEPROM connected flash nonvolatile memory cells are formed to initiate a Fowler-Nordheim tunneling phenomena while minimizing operational disturbances in with in unselected EEPROM connected flash nonvolatile memory cells;

coupling a ground reference voltage level to the control gate of the charge retaining memory transistor of unselected EEPROM connected flash nonvolatile memory cells of a selected block, and disconnecting the control gate of the charge retaining memory transistor of the EEPROM connected flash nonvolatile memory cells so that the very high negative erase voltage is coupled from the isolation diffusion well to the control gate of the charge retaining memory transistor of the unselected EEPROM connected flash nonvolatile memory cells in unselected blocks.

2. The method for operating an array of EEPROM connected flash nonvolatile memory cells of claim 1 further comprising:

reading selected EEPROM connected flash nonvolatile memory cells by the steps of:

applying a read reference voltage to a control gate of the charge retaining memory transistor within the selected EEPROM connected flash nonvolatile memory cells, and applying a read biasing voltage level to a drain of the charge retaining memory transistor of the selected EEPROM connected flash nonvolatile memory cells to pre-charge a bit line connected to the drain of the selected EEPROM connected flash nonvolatile memory cells such that if the selected EEPROM connected flash nonvolatile memory cells are erased the read biasing voltage does not change and if the selected EEPROM connected flash nonvolatile memory cells is programmed, the selected EEPROM connected flash nonvolatile memory cells turns on allowing the bit line to discharge to a ground reference voltage level.

3. The method for operating an array of EEPROM connected flash nonvolatile memory cells of claim 1 wherein the very large positive programming voltage and the very large positive erase voltage have a range of from approximately +8.0V to approximately +10.0V and the high program voltage is approximately +5.0V.

4. The method for operating an array of EEPROM connected flash nonvolatile memory cells of claim 1 wherein the very large negative programming voltage and the very large negative erase voltage have a range of from approximately −10.0V to approximately −8.0V.

5. The method for operating an array of EEPROM connected flash nonvolatile memory cells of claim 2 wherein the read reference voltage at a voltage level approximately equal distance between a first boundary of a programmed threshold voltage level and a second boundary of an erased threshold voltage level.

6. The method for operating an array of EEPROM connected flash nonvolatile memory cells of claim 5 wherein the first boundary of the programmed threshold voltage level is +1.0V.

7. The method for operating an array of EEPROM connected flash nonvolatile memory cells of claim 5 wherein the second boundary of the erased threshold voltage level is +4.0V.

8. The method for operating an array of EEPROM connected flash nonvolatile memory cells of claim 5 wherein the read reference voltage is approximately the voltage level of the power supply voltage source.

9. The method for operating an array of EEPROM connected flash nonvolatile memory cells of claim 5 wherein the power supply voltage source is 1.8V or 3.0V.

10. A nonvolatile memory device comprising:

an array of EEPROM configured nonvolatile memory cells arranged in rows and columns and partitioned into to columns and pages, such that each of the EEPROM configured nonvolatile memory cells comprise a floating gate memory transistor for storing a digital datum, and a floating gate select transistor connected to the floating gate memory transistor for connecting the floating gate memory transistor to a bit line associated with a column of the EEPROM configured nonvolatile memory cells for reading, programming, verifying, and erasing;

a row decoder that receives an address, decodes the address to select one of EEPROM configured nonvolatile memory cells, and provides word line biasing voltages to word lines connecting gates of the floating gate memory transistors of the one block of the EEPROM configured nonvolatile memory cells for selecting one page and inhibiting unselected pages of the block for reading, programming, verifying, and erasing selected EEPROM configured nonvolatile memory cells;

a select gate decoder that receives the address, decodes the address to select the selected row of EEPROM configured nonvolatile memory cells, and provides select gate biasing voltages to a select line connecting gates of the floating gate select transistors of on the one row of the EEPROM configured nonvolatile memory cells for connecting the floating gate memory transistor to bit lines of columns of the EEPROM configured nonvolatile memory cells for reading, programming, verifying, and erasing comprising:
- a second block selector circuit that receives the address, decodes a block portion of the address, and activates when a block address indicates that one block of the array of EEPROM configured nonvolatile memory cells is selected;
- a select gate word line selector circuit, which based on a row address provides the word lines of the one page with word line biasing voltage levels necessary for biasing control gates of the floating gate select transistors of the EEPROM configured nonvolatile memory cells connected to the word lines for reading, programming, verifying, and erasing; and
- a select gate voltage level shifter connected to the second block selector circuit to shift the voltage level of the block selector signals for activating pass transistors to transfer select gate control biasing voltages to the select gate control lines connected to the control gate of the floating gate select transistor of each of the EEPROM configured nonvolatile memory cells of the selected block to activate one page of the EEPROM configured nonvolatile memory cells for reading, programming, verifying, and erasing the selected nonvolatile memory cells;
- a column decoder in communication with bit lines connected to the floating gate select transistors for providing bit line biasing voltages for reading, programming, verifying, and erasing selected EEPROM configured nonvolatile memory cells;
- wherein the row decoder, select gate decoder, and column decoder provide inhibit biasing voltage levels to all the non-selected nonvolatile EEPROM configured nonvolatile memory cells to minimize disturbances resulting from the reading, programming, verifying, and erasing selected EEPROM configured nonvolatile memory cells
- wherein an amplitude of the word line biasing voltages, the select gate biasing voltage, bit line biasing voltages, and the inhibit biasing voltages do not exceed a drain-to-source break down voltage of transistors forming the row decoder, select gate decoder, and column decoder.

11. The nonvolatile memory device of claim 10 wherein the row decoder comprises:
- a first block selector that activates when a block address indicates that one block of the array of EEPROM configured nonvolatile memory cells is selected;
- a row word line selector circuit, which based on a row address provides the word lines of the one page with word line biasing voltage levels necessary for biasing control gates of the floating gate memory transistors of the EEPROM configured nonvolatile memory cells connected to the word lines for reading, programming, verifying, and erasing; and
- a block select voltage level shifter connected to the first block selector for shifting a voltage level of a block select signal to activate pass gates in the word line selector circuit to transfer the word line biasing voltage levels to the word lines of the selected block for biasing the control gates of the EEPROM configured nonvolatile memory cells of the block for reading, programming, verifying, and erasing the selected nonvolatile memory cells.

12. The nonvolatile memory device of claim 10 wherein for reading a selected page of the array of EEPROM configured nonvolatile memory cells:
- the row decoder transfers a read reference biasing voltage level to the word line of the selected EEPROM configured nonvolatile memory cells;
- the row decoder further transfers a first read reference biasing voltage level to the word lines of the word lines of the unselected EEPROM configured nonvolatile memory cells in the selected and unselected blocks;
- the column decoder transfers a first read biasing voltage to the drains of the selected EEPROM configured nonvolatile memory cells and the voltage level of the ground reference voltage source to the drains of the unselected EEPROM configured nonvolatile memory cells;
- the select gate decoder transfers a first activate select gate signal to the select gate control lines of one page of the selected EEPROM configured nonvolatile memory cells and transfers a a first deactivate select gate signal to the select gate control lines of the unselected EEPROM configured nonvolatile memory cells; and
- wherein the source lines of the EEPROM configured nonvolatile memory cells are set to the voltage level of the ground reference voltage source.

13. The nonvolatile memory device of claim 12 wherein the first read biasing voltage has a voltage level of approximately +1.0V.

14. The nonvolatile memory device of claim 12 wherein the first read reference biasing voltage level is approximately the voltage level of the power supply voltage source.

15. The nonvolatile memory device of claim 14 wherein the voltage level of the power supply voltage source is +1.8V or +3.0V.

16. The nonvolatile memory device of claim 12 wherein the first activate select gate signal has a voltage level of approximately +5.0V and the first deactivate select gate signal has a voltage level of the voltage level of the ground reference voltage source.

17. The nonvolatile memory device of claim 10 wherein for erasing a selected page of the array of EEPROM configured nonvolatile memory cells;
- the row decoder transfers a very high positive erase voltage to the word line of the one page the selected EEPROM configured nonvolatile memory cells and transfers the ground reference voltage level to the word lines of the unselected EEPROM configured nonvolatile memory cells of the selected block;
- the row decoders of unselected blocks of EEPROM configured nonvolatile memory cells disconnect the word lines of the unselected EEPROM configured nonvolatile memory cells so that the very high negative erase voltage is coupled from the isolation well of the first impurity type to the word lines of the unselected EEPROM configured nonvolatile memory cells in unselected blocks; and
- the select gate decoder transfers the very high negative erase voltage to the selected and unselected select gate control lines;
- wherein an isolation well of the first impurity type into which the array of EEPROM configured nonvolatile memory cells is formed and the source lines of the EEPROM configured nonvolatile memory cells are set to the very high negative erase voltage level.

18. The nonvolatile memory device of claim 17 wherein the voltage levels of the very high positive erase voltage and the very high negative erase voltage is approximately the breakdown voltage level of transistors forming the row decoder, column decoder, and the select gate decoder.

19. The nonvolatile memory device of claim 17 wherein the voltage level of the very high positive erase voltage is from approximately +8.0V to approximately +10.0V.

20. The nonvolatile memory device of claim 17 wherein the voltage level of the very high negative erase voltage is from approximately −10.0V to approximately −8.0V.

21. The nonvolatile memory device of claim 17 wherein for verifying a page erase a selected page of the array of EEPROM configured nonvolatile memory cells:
the row decoder transfers a voltage level of a lower boundary of an erased threshold voltage level to the word line of the selected and unselected EEPROM configured nonvolatile memory cells;
the column decoder transfers a second read biasing voltage to the drains of the selected EEPROM configured nonvolatile memory cells; and
the select gate decoder transfers a second activate select gate signal to the select gate control lines of the selected pages of the selected EEPROM configured nonvolatile memory cells and transfers a second deactivate select gate signal to the select gate control lines of the unselected EEPROM configured nonvolatile memory cells;
wherein the source lines of the EEPROM configured nonvolatile memory cells are set to the voltage level of the ground reference voltage source.

22. The nonvolatile memory device of claim 21 wherein the lower boundary of an erased threshold voltage level is approximately +4.0V.

23. The nonvolatile memory device of claim 21 wherein the voltage level of the second read biasing voltage is pre-charged to approximately the voltage level of the power supply voltage source less a threshold voltage of an NMOS transistor wherein the pre-charged level of the second read biasing voltage is discharged to approximately 0.0V when the memory cell has not been successfully erased and has a threshold voltage level is less than the lower boundary of the erased threshold voltage level and wherein if the EEPROM configured nonvolatile memory cells are erased, the pre-charged level will be maintained when the threshold voltage of the erased EEPROM configured nonvolatile memory cells is greater than the erased threshold voltage level.

24. The nonvolatile memory device of claim 21 wherein the second activate select gate signal has a voltage level of approximately +5.0V and the second deactivate select gate signal has a voltage level of the voltage level of the ground reference voltage source.

25. The nonvolatile memory device of claim 10 wherein for erasing a selected block of the array of EEPROM configured nonvolatile memory cells;
the row decoder transfers a very high positive erase voltage to all the word lines of the EEPROM configured nonvolatile memory cells of the selected block;
the row decoders of the unselected blocks of EEPROM configured nonvolatile memory cells disconnect the word lines of the unselected EEPROM configured nonvolatile memory cells so that the very high negative erase voltage is coupled from the isolation well of the first impurity type to the word lines of the unselected EEPROM configured nonvolatile memory cells in unselected blocks; and
the select gate decoder transfers the very high negative erase voltage to the selected and unselected select gate control lines;
wherein the source lines of the EEPROM configured nonvolatile memory cells and the isolation well of the first impurity type are set to the voltage level of the very high negative erase voltage.

26. The nonvolatile memory device of claim 25 wherein the voltage levels of the very high positive erase voltage and the very high negative erase voltage is approximately the breakdown voltage level of transistors forming the row decoder, column decoder, and the select gate decoder.

27. The nonvolatile memory device of claim 26 wherein the voltage level of the very high positive erase voltage is from approximately +8.0V to approximately +10.0V.

28. The nonvolatile memory device of claim 26 wherein the voltage level of the very high negative erase voltage is from approximately −8.0V to approximately −10.0V.

29. The nonvolatile memory device of claim 25 wherein for verifying a block erase:
the row decoder transfers a voltage level of the lower boundary of an erased threshold voltage level to the word line of the selected and unselected EEPROM configured nonvolatile memory cells;
the column decoder transfers a third read biasing voltage to the drains of the selected EEPROM configured nonvolatile memory cells; and
the select gate decoder transfers a third activate select gate signal to the select gate control lines of the selected EEPROM configured nonvolatile memory cells and transfers a third deactivate select gate signal to the select gate control lines of the unselected EEPROM configured nonvolatile memory cells;
wherein the source lines of the EEPROM configured nonvolatile memory cells are set to the voltage level of the ground reference voltage source.

30. The nonvolatile memory device of claim 29 wherein the lower boundary of the erased threshold voltage level is approximately +4.0V for the single level cell program.

31. The nonvolatile memory device of claim 29 wherein the voltage level of the third read biasing voltage is pre-charged to approximately the voltage level of the power supply voltage source less a threshold voltage of an NMOS transistor, wherein the pre-charged level of the second read biasing voltage is discharged to approximately 0.0V when the memory cell has not been successfully erased and has a threshold voltage level is less than the lower boundary of the erased threshold voltage level, and wherein if the EEPROM configured nonvolatile memory cells are erased, the pre-charged level will be maintained when the threshold voltage of the erased EEPROM configured nonvolatile memory cells is greater than the erased threshold voltage level.

32. The nonvolatile memory device of claim 29 wherein the third activate select gate signal has a voltage level of approximately +5.0V and the third deactivate select gate signal has a voltage level of the voltage level of the ground reference voltage source.

33. The nonvolatile memory device of claim 10 wherein for erasing an entire chip containing the array of EEPROM configured nonvolatile memory cells:
the row decoder transfers the very high positive erase voltage to all the word lines of the EEPROM configured nonvolatile memory cells of the entire chip; and
the select gate decoder transfers the very high negative erase voltage to all the select gate control lines of the entire chip;
wherein the source lines of all the EEPROM configured nonvolatile memory cells and the isolation well of the first impurity type are set to the very high negative erase voltage level.

34. The nonvolatile memory device of claim 33 wherein the voltage levels of the very high positive erase voltage and the very high negative erase voltage is approximately the breakdown voltage level of transistors forming the row decoder, column decoder, and the select gate decoder.

35. The nonvolatile memory device of claim 33 wherein the voltage level of the very high positive erase voltage is from approximately +8.0V to approximately +10.0V.

36. The nonvolatile memory device of claim 33 wherein the voltage level of the very high negative erase voltage is from approximately −8.0V to approximately −10.0V.

37. The nonvolatile memory device of claim 33 wherein for verifying erasing an entire chip:
the row decoder transfers a voltage level of a lower boundary of the erased threshold voltage level to the word line of the selected and unselected EEPROM configured nonvolatile memory cells;
the column decoder transfers a fourth read biasing voltage level to the drains of the selected EEPROM configured nonvolatile memory cells; and
the select gate decoder transfers a fourth activate select gate signal to the select gate control lines of the selected EEPROM configured nonvolatile memory cells;
wherein the source lines of the EEPROM configured nonvolatile memory cells are set to the voltage level of the ground reference voltage source.

38. The nonvolatile memory device of claim 37 wherein the lower boundary of the erased threshold voltage level is approximately +4.0V for the single level cell program.

39. The nonvolatile memory device of claim 37 wherein the voltage level of the fourth read biasing voltage is pre-charged to approximately the voltage level of the power supply voltage source less a threshold voltage of an NMOS transistor.

40. The nonvolatile memory device of claim 37 wherein the voltage level of the fourth read biasing voltage is pre-charged to approximately the voltage level of the power supply voltage source less a threshold voltage of an NMOS transistor, wherein the pre-charged level of the second read biasing voltage is discharged to approximately 0.0V when the memory cell has not been successfully erased and has a threshold voltage level is less than the lower boundary of the erased threshold voltage level, and wherein if the EEPROM configured nonvolatile memory cells are erased, the pre-charged level will be maintained when the threshold voltage of the erased EEPROM configured nonvolatile memory cells is greater than the erased threshold voltage level.

41. The nonvolatile memory device of claim 37 wherein the fourth activate select gate signal has a voltage level of approximately +5.0V.

42. The nonvolatile memory device of claim 10 wherein for programming a selected page of the array of EEPROM configured nonvolatile memory cells:
the row decoder transfers a very high negative program voltage to the word line of the selected EEPROM configured nonvolatile memory cells;
the row decoder transfers a voltage level of the ground reference voltage source to the unselected word lines of the selected block and disconnects the unselected word lines to float the unselected word lines of the unselected blocks of the array of EEPROM configured nonvolatile memory cells;
the column decoder transfers a high program select voltage level to the bit lines and thus to the drains of the selected EEPROM configured nonvolatile memory cells that are to be programmed;
the column decoder transfers a low program deselect voltage level to the bit lines and thus to the drains of the selected EEPROM configured nonvolatile memory cells that are not to be programmed; and
the select gate decoder transfers a high positive activate select gate signal to the select gate control lines connected to the selected EEPROM configured nonvolatile memory cells and transfers a program inhibit select gate signal to the select gate control lines connected to the unselected EEPROM configured nonvolatile memory cells to allow the EEPROM configured nonvolatile memory cells to float or deactivate the floating gate select transistor of the unselected nonvolatile memory cells to isolate the unselected nonvolatile memory cells from being programmed;
wherein the source lines of the EEPROM configured nonvolatile memory cells are set to the voltage level of the ground reference voltage source.

43. The nonvolatile memory device of claim 42 wherein the voltage level of the very high negative program voltage and the high positive program select voltage is less than the breakdown voltage level of transistors forming the row decoder.

44. The nonvolatile memory device of claim 42 wherein the voltage level of the high negative program voltage is from approximately −8.0V to approximately −10.0V.

45. The nonvolatile memory device of claim 42 wherein the high positive program select voltage is from approximately +8.0V to approximately +10.0V.

46. The nonvolatile memory device of claim 42 wherein the voltage level of the high positive activate select gate signal is from approximately is from approximately −8.0V to approximately −10.0V and the voltage level of the program inhibit select gate signal is from approximately −2.0V to the voltage level of the ground reference voltage source (0.0V) to avoid programming of the unselected EEPROM configured nonvolatile memory cells.

47. The nonvolatile memory device of claim 10 wherein for verifying a page program, a selected page of the array of EEPROM configured nonvolatile memory cells:
the row decoder transfers a voltage level of a lower boundary of the erased threshold voltage level to the word line of the selected and unselected EEPROM configured nonvolatile memory cells
the column decoder transfers a fifth read biasing voltage level to the drains of the selected EEPROM configured nonvolatile memory cells; and
the select gate decoder transfers the fifth activate select gate signal to the select gate control lines of the selected EEPROM configured nonvolatile memory cells and transfers the fourth deactivate select gate signal to the select gate control lines of the unselected EEPROM configured nonvolatile memory cells;
wherein the source lines of the EEPROM configured nonvolatile memory cells are set to the voltage level of the ground reference voltage source.

48. The nonvolatile memory device of claim 47 wherein the lower boundary of an erased threshold voltage level is approximately +4.0V for the single level cell program.

49. The nonvolatile memory device of claim 47 wherein the voltage level of the fifth read biasing voltage is pre-charged to approximately the voltage level of the power supply voltage source less a threshold voltage of an NMOS transistor.

50. The nonvolatile memory device of claim 49 wherein the pre-charged level of the fifth read biasing voltage is discharged to approximately 0.0V when the memory cell has been successfully programmed and has a threshold voltage level is less than the upper boundary of the programmed threshold voltage level, and if the EEPROM configured nonvolatile memory cells are not programmed, the pre-charged level will be maintained when the threshold voltage of the erased EEPROM configured nonvolatile memory cells is greater than the upper boundary of the programmed threshold voltage level.

51. The nonvolatile memory device of claim 47 wherein fifth activate select gate signal has a voltage level of approximately +5.0V.

52. The nonvolatile memory device of claim 47 wherein the fourth deactivate select gate signal has a voltage level of the voltage level of the ground reference voltage source.

53. A method for operating a nonvolatile memory device comprising the steps of:
providing array of EEPROM configured nonvolatile memory cells arranged in rows and columns and partitioned into to columns and pages, such that each of the EEPROM configured nonvolatile memory cells comprise
a floating gate memory transistor for storing a digital datum, and
a floating gate select transistor connected to the floating gate memory transistor for activating the floating gate memory transistor for reading, programming, verifying, and erasing;
receiving an address;
decoding the address to select one block of EEPROM configured nonvolatile memory cells;
applying word line biasing voltages to word lines connecting gates of the floating gate memory transistors of one block of the EEPROM configured nonvolatile memory cells for selecting one page and inhibiting unselected pages of the block;
applying select gate biasing voltages to a select line connecting gates of the floating gate select transistors of on the one row of the EEPROM configured nonvolatile memory cells for connecting the floating gate memory transistor to bit lines of columns of the EEPROM configured nonvolatile memory cells;
applying bit line biasing voltages for reading, programming, verifying, and erasing selected EEPROM configured nonvolatile memory cells;
providing inhibit biasing voltage levels to all the nonselected nonvolatile EEPROM configured nonvolatile memory cells to minimize disturbances resulting from the reading, programming, verifying, and erasing selected EEPROM configured nonvolatile memory cells;
reading one page of one block of the selected EEPROM configured nonvolatile memory cells;
programming one page of one block of the selected EEPROM configured nonvolatile memory cells;
verifying programming of the one page of one block of the selected EEPROM configured nonvolatile memory cells;
erasing one page, one block or an entire chip of selected EEPROM configured nonvolatile memory cells, comprising:
applying a very high positive erase voltage to the word line of the one page the selected EEPROM configured nonvolatile memory cells,
transferring the ground reference voltage level to the word lines of the unselected EEPROM configured nonvolatile memory cells of the selected block,
disconnecting the word lines of the unselected EEPROM configured nonvolatile memory cells so that the very high negative erase voltage is coupled from an isolation well of the first impurity type to the word lines of the unselected EEPROM configured nonvolatile memory cells in unselected blocks,
applying the very high negative erase voltage to the selected and unselected select gate control lines, and
setting the isolation well of the first impurity type into which the array of EEPROM configured nonvolatile memory cells is formed and the source lines of the EEPROM configured nonvolatile memory cells to the very high negative erase voltage level;
wherein an amplitude of the word line biasing voltages, the select gate biasing voltage, bit line biasing voltages, and the inhibit biasing voltages do not exceed a drain-to-source break down voltage of transistors forming circuitry peripheral to the array of EEPROM configured nonvolatile memory cells.

54. The method for operating the nonvolatile memory device of claim 53 wherein the step of reading a selected page of the array of EEPROM configured nonvolatile memory cells comprises the steps of:
applying a first read reference biasing voltage to the word line of the selected EEPROM configured nonvolatile memory cells;
applying the first read reference biasing voltage level to the word lines of the word lines of the unselected EEPROM configured nonvolatile memory cells in the selected and unselected blocks;
applying a first read biasing voltage to the drains of the selected EEPROM configured nonvolatile memory cells and the voltage level of the ground reference voltage source to the drains of the unselected EEPROM configured nonvolatile memory cells;
applying a first activate select gate signal to the select gate control lines of one page of the selected EEPROM configured nonvolatile memory cells and transfers a first deactivate select gate signal to the select gate control lines of the unselected EEPROM configured nonvolatile memory cells; and
setting to the voltage level of the ground reference voltage source the source lines of the EEPROM configured nonvolatile memory cells.

55. The method for operating the nonvolatile memory device of claim 54 wherein the first read biasing voltage has a voltage level of approximately +1.0V.

56. The method for operating the nonvolatile memory device of claim 54 wherein the first read biasing voltage level is approximately the voltage level of the power supply voltage source.

57. The method for operating the nonvolatile memory device of claim 56 wherein he voltage level of the power supply voltage source is +1.8V or +3.0V.

58. The method for operating the nonvolatile memory device of claim 54 wherein the first activate select gate signal has a voltage level of approximately +5.0V and the first deactivate select gate signal has a voltage level of the voltage level of the ground reference voltage source.

59. The method for operating the nonvolatile memory device of claim 53 wherein the voltage levels of the very high positive erase voltage and the very high negative erase voltage is approximately the breakdown voltage level of transistors forming the row decoder, column decoder, and the select gate decoder.

60. The method for operating the nonvolatile memory device of claim 53 wherein the voltage level of the very high positive erase voltage is from approximately +8.0V to approximately +10.0V.

61. The method for operating the nonvolatile memory device of claim 53 wherein the voltage level of the very high negative erase voltage is from approximately −10.0V to approximately −8.0V.

62. The method for operating the nonvolatile memory device of claim 53 wherein the step of verifying a page erase a selected page of the array of EEPROM configured nonvolatile memory cells comprises the steps of:
applying a voltage level of a lower boundary of an erased threshold voltage level to the word line of the selected and unselected EEPROM configured nonvolatile memory cells;
applying a second read biasing voltage to the drains of the selected EEPROM configured nonvolatile memory cells; and
applying a second activate select gate signal to the select gate control lines of the selected pages of the selected EEPROM configured nonvolatile memory cells;
applying a second deactivate select gate signal to the select gate control lines of the unselected EEPROM configured nonvolatile memory cells;
setting the source lines of the EEPROM configured nonvolatile memory cells to the voltage level of the ground reference voltage source.

63. The method for operating the nonvolatile memory device of claim 62 wherein the lower boundary of an erased threshold voltage level is approximately +4.0V.

64. The method for operating the nonvolatile memory device of claim 62 wherein applying the voltage level of the second read biasing voltage comprises the steps of:
pre-charging the bit lines to approximately the voltage level of the power supply voltage source less a threshold voltage of an NMOS transistor;
discharging the pre-charged level of the second read biasing voltage is discharged to approximately 0.0V when the memory cell has not been successfully erased and has a threshold voltage level is less than the lower boundary of the erased threshold voltage level; and
maintaining the pre-charged level when the threshold voltage of the erased EEPROM configured nonvolatile memory cells is greater than the erased threshold voltage level, if the EEPROM configured nonvolatile memory cells are erased.

65. The method for operating the nonvolatile memory device of claim 62 wherein the second activate select gate signal has a voltage level of approximately +5.0V and the second deactivate select gate signal has a voltage level of the voltage level of the ground reference voltage source.

66. The method for operating the nonvolatile memory device of claim 53 wherein the step of erasing a selected block of the array of EEPROM configured nonvolatile memory cells comprises the steps of
applying the very high positive erase voltage to all the word lines of the EEPROM configured nonvolatile memory cells of the selected block;
disconnecting the word lines of the unselected EEPROM configured nonvolatile memory cells so that the very high negative erase voltage is coupled from the isolation well of the first impurity type to the word lines of the unselected EEPROM configured nonvolatile memory cells in unselected blocks; and
applying the very high negative erase voltage to the selected and unselected select gate control lines;
setting the source lines of the EEPROM configured nonvolatile memory cells and the isolation well of the first impurity type to the voltage level of the very high negative erase voltage.

67. The method for operating the nonvolatile memory device of claim 66 wherein the voltage levels of the very high positive erase voltage and the very high negative erase voltage is approximately the breakdown voltage level of transistors forming the row decoder, column decoder, and the select gate decoder.

68. The method for operating the nonvolatile memory device of claim 66 wherein the voltage level of the very high positive erase voltage is from approximately +8.0V to approximately +10.0V.

69. The method for operating the nonvolatile memory device of claim 66 wherein the voltage level of the very high negative erase voltage is from approximately −8.0V to approximately −10.0V.

70. The method for operating the nonvolatile memory device of claim 66 wherein the step of verifying a block erase comprises the steps of:
applying the voltage level of the lower boundary of the erased threshold voltage level to the word line of the selected and unselected EEPROM configured nonvolatile memory cells;
applying a third read biasing voltage level to the drains of the selected EEPROM configured nonvolatile memory cells;
applying the third activate select gate signal to the select gate control lines of the selected EEPROM configured nonvolatile memory cells;
applying a second deactivate select gate signal to the select gate control lines of the unselected EEPROM configured nonvolatile memory cells; and
setting the source lines of the EEPROM configured nonvolatile memory cells to the voltage level of the ground reference voltage source.

71. The method for operating the nonvolatile memory device of claim 70 wherein the lower boundary of an erased threshold voltage level is approximately +4.0V for the single level cell program.

72. The method for operating the nonvolatile memory device of claim 70 wherein applying the voltage level of the third read biasing voltage comprises the steps of:
pre-charging the bit lines to approximately the voltage level of the power supply voltage source less a threshold voltage of an NMOS transistor;
discharging the pre-charged level of the third read biasing voltage is discharged to approximately 0.0V when the memory cell has not been successfully erased and has a threshold voltage level is less than the lower boundary of the erased threshold voltage level; and
maintaining the pre-charged level when the threshold voltage of the erased EEPROM configured nonvolatile memory cells is greater than the erased threshold voltage level, if the EEPROM configured nonvolatile memory cells are erased.

73. The method for operating the nonvolatile memory device of claim 70 wherein the third activate select gate signal has a voltage level of approximately +5.0V and the third deactivate select gate signal has a voltage level of the voltage level of the ground reference voltage source.

74. The method for operating the nonvolatile memory device of claim 53 wherein the step of erasing an entire chip containing the array of EEPROM configured nonvolatile memory cells comprises the steps of:
applying the very high positive erase voltage to all the word lines of the EEPROM configured nonvolatile memory cells of the entire chip;
applying the very high negative erase voltage to all the select gate control lines of the entire chip; and setting the source lines of all the EEPROM configured nonvolatile memory cells and the isolation well of the first impurity type to the very high negative erase voltage level.

75. The method for operating the nonvolatile memory device of claim 74 wherein the voltage levels of the very high positive erase voltage and the very high negative erase voltage is approximately the breakdown voltage level of transistors forming the row decoder, column decoder, and the select gate decoder.

76. The method for operating the nonvolatile memory device of claim 74 wherein the voltage level of the very high positive erase voltage is from approximately +8.0V to approximately +10.0V.

77. The method for operating the nonvolatile memory device of claim 74 wherein the voltage level of the very high negative erase voltage is from approximately −8.0V to approximately −10.0V.

78. The method for operating the nonvolatile memory device of claim 74 wherein the step of verifying erasing an entire chip comprises the steps:
applying a voltage level of the lower boundary of the erased threshold voltage level to the word line of the selected and unselected EEPROM configured nonvolatile memory cells;
applying a fourth read biasing voltage to the drains of the selected EEPROM configured nonvolatile memory cells;
applying a fourth activate select gate signal to the select gate control lines of the selected EEPROM configured nonvolatile memory cells; and
setting the source lines of the EEPROM configured nonvolatile memory cells to the voltage level of the ground reference voltage source.

79. The method for operating the nonvolatile memory device of claim 77 wherein the lower boundary of an erased threshold voltage level is approximately +4.0V for the single level cell program.

80. The method for operating the nonvolatile memory device of claim 77 wherein the voltage level of the second fourth read voltage is pre-charged to approximately the voltage level of the power supply voltage source less a threshold voltage of an NMOS transistor.

81. The method for operating the nonvolatile memory device of claim 79 wherein applying the voltage level of the fourth read biasing voltage comprises the steps of:
pre-charging the bit lines to approximately the voltage level of the power supply voltage source less a threshold voltage of an NMOS transistor;
discharging the pre-charged level of the fourth read biasing voltage is discharged to approximately 0.0V when the memory cell has not been successfully erased and has a threshold voltage level is less than the lower boundary of the erased threshold voltage level; and
maintaining the pre-charged level when the threshold voltage of the erased EEPROM configured nonvolatile memory cells is greater than the erased threshold voltage level, if the EEPROM configured nonvolatile memory cells are erased.

82. The method for operating the nonvolatile memory device of claim 77 wherein the fourth activate select gate signal has a voltage level of approximately +5.0V.

83. The method for operating the nonvolatile memory device of claim 53 wherein the step of programming a selected page of the array of EEPROM configured nonvolatile memory cells:

applying a very high negative program voltage to the word line of the selected EEPROM configured nonvolatile memory cells;
applying a voltage level of the ground reference voltage source to the unselected word lines is the selected block;
disconnecting the unselected word lines to float the unselected word lines of the unselected blocks of the array of EEPROM configured nonvolatile memory cells;
applying a high program select voltage level to the bit lines and thus to the drains of the selected EEPROM configured nonvolatile memory cells that are to be programmed;
applying a low program deselect voltage level to the bit lines and thus to the drains of the selected EEPROM configured nonvolatile memory cells that are not to be programmed;
applying a high positive activate select gate signal to the select gate control lines connected to the selected nonvolatile voltage cells and transfers a low deactivate select gate signal to the select gate control lines connected to the unselected EEPROM configured nonvolatile memory cells to deactivate the floating gate select transistor of the unselected EEPROM configured nonvolatile memory cells to isolate the unselected nonvolatile memory cells from being programmed; and
setting the source lines of the EEPROM configured nonvolatile memory cells the voltage level of the ground reference voltage source.

84. The method for operating the nonvolatile memory device of claim 82 wherein the voltage level of the very high negative program voltage and the high positive program select voltage is less than the breakdown voltage level of transistors forming the row decoder.

85. The method for operating the nonvolatile memory device of claim 82 wherein the voltage level of the high negative program voltage is from approximately −8.0V to approximately −10.0V.

86. The method for operating the nonvolatile memory device of claim 82 wherein the high positive program select voltage is from approximately +8.0V to approximately +10.0V.

87. The method for operating the nonvolatile memory device of claim 82 wherein the voltage level of the high positive activate select gate signal is from approximately is from approximately −8.0V to approximately −10.0V and the low program deselect voltage level is from approximately −2.0V to the voltage level of the ground reference voltage source (0.0V) to avoid programming of the unselected EEPROM configured nonvolatile memory cells.

88. The method for operating the nonvolatile memory device of claim 82 wherein for verifying a page program, a selected page of the array of EEPROM configured nonvolatile memory cells:
applying a voltage level of an upper boundary of an programmed threshold voltage level to the word line of the selected and unselected EEPROM configured nonvolatile memory cells
applying a fifth read biasing voltage level to the drains of the selected EEPROM configured nonvolatile memory cells;
applying the fifth activate select gate signal to the select gate control lines of the selected EEPROM configured nonvolatile memory cells;
applying a fourth deactivate select gate signal to the select gate control lines of the unselected EEPROM configured nonvolatile memory cells; and setting the source lines of the EEPROM configured nonvolatile memory cells to the voltage level of the ground reference voltage source.

89. The method for operating the nonvolatile memory device of claim 87 wherein the upper boundary of the programmed threshold voltage level is approximately +1.0V for the single level cell program.

90. The method for operating the nonvolatile memory device of claim 87 wherein the voltage level of the second fifth read voltage is pre-charged to approximately the voltage level of the power supply voltage source less a threshold voltage of an NMOS transistor.

91. The method for operating the nonvolatile memory device of claim 87 wherein applying the voltage level of the fifth read biasing voltage comprises the steps of:
   pre-charging the bit lines to approximately the voltage level of the power supply voltage source less a threshold voltage of an NMOS transistor;
   discharging the pre-charged level of the fifth read biasing voltage is discharged to approximately 0.0V when the memory cell has not been successfully programmed and has a threshold voltage level is less than the upper boundary of the programmed threshold voltage level; and
   maintaining the pre-charged level when the threshold voltage of the erased EEPROM configured nonvolatile memory cells is greater than the programmed threshold voltage level, if the EEPROM configured nonvolatile memory cells are not programmed.

92. The method for operating the nonvolatile memory device of claim 90 wherein the fifth select gate signal has a voltage level of approximately +5.0V.

93. The method for operating the nonvolatile memory device of claim 90 wherein the fourth deactivate select gate signal has a voltage level of the voltage level of the ground reference voltage source.

* * * * *